United States Patent
Feldmann

(10) Patent No.: US 9,298,102 B2
(45) Date of Patent: Mar. 29, 2016

(54) PROJECTION LENS WITH WAVEFRONT MANIPULATOR

(71) Applicant: Carl Zeiss SMT GmbH, Oberkochen (DE)

(72) Inventor: Heiko Feldmann, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 136 days.

(21) Appl. No.: 14/173,982

(22) Filed: Feb. 6, 2014

(65) Prior Publication Data

US 2014/0268084 A1 Sep. 18, 2014

Related U.S. Application Data

(60) Provisional application No. 61/779,181, filed on Mar. 13, 2013.

(51) Int. Cl.
*G03B 27/68* (2006.01)
*G03F 7/20* (2006.01)

(52) U.S. Cl.
CPC ............ *G03F 7/70266* (2013.01); *G03F 7/706* (2013.01); *G03F 7/70308* (2013.01)

(58) Field of Classification Search
CPC .............. G03F 7/7015; G03F 7/70266; G03F 7/70308; G03F 7/706
See application file for complete search history.

(56) References Cited

U.S. PATENT DOCUMENTS

| | | | | |
|---|---|---|---|---|
| 4,965,630 A * | 10/1990 | Kato | .................. | G03F 7/70241 355/52 |
| 5,677,757 A * | 10/1997 | Taniguchi | ............... | G03F 7/701 355/53 |
| 5,789,734 A * | 8/1998 | Torigoe | ............... | G03F 7/70241 250/201.2 |
| 5,831,715 A * | 11/1998 | Takahashi | .......... | G03F 7/70216 355/52 |
| 6,104,472 A * | 8/2000 | Suzuki | ................ | G03F 7/70258 355/53 |
| 6,333,776 B1 * | 12/2001 | Taniguchi | .......... | G03F 7/70091 355/52 |
| 7,446,952 B2 | 11/2008 | Epple | | |
| 7,830,611 B2 | 11/2010 | Conradi et al. | | |
| 2007/0165202 A1 | 7/2007 | Koehler et al. | | |
| 2007/0296938 A1 * | 12/2007 | Tel | ......................... | G03B 27/53 355/53 |

(Continued)

FOREIGN PATENT DOCUMENTS

DE 10 2011 077 784 12/2012
WO EP 0 851 304 A2 7/1998

(Continued)

OTHER PUBLICATIONS

German Office Action, with translation thereof, for corresponding DE Appl No. 10 2013 204 391.0, dated Jun. 27, 2013.

(Continued)

*Primary Examiner* — Deoram Persaud
(74) *Attorney, Agent, or Firm* — Fish & Richardson P.C.

(57) ABSTRACT

A projection lens for imaging a pattern arranged in an object plane of the projection lens into an image plane of the projection lens via electromagnetic radiation having an operating wavelength $\lambda < 260$ nm has a multiplicity of optical elements having optical surfaces which are arranged in a projection beam path between the object plane (OS) and the image plane. Provision is made of a wavefront manipulation system for dynamically influencing the wavefront of the projection radiation passing from the object plane to the image plane.

20 Claims, 12 Drawing Sheets

(56) References Cited

U.S. PATENT DOCUMENTS

| | | | |
|---|---|---|---|
| 2008/0174759 A1* | 7/2008 | Schuster | G03F 7/70966 355/71 |
| 2009/0046268 A1 | 2/2009 | Omura et al. | |
| 2009/0174876 A1* | 7/2009 | Schriever et al. | 355/69 |
| 2010/0134891 A1 | 6/2010 | Mueller et al. | |
| 2010/0231888 A1 | 9/2010 | Mueller et al. | |
| 2012/0320358 A1* | 12/2012 | Ruoff | 355/67 |
| 2014/0104587 A1 | 4/2014 | Freimann et al. | |
| 2015/0168674 A1* | 6/2015 | Bittner | G03F 7/70216 355/67 |
| 2015/0227052 A1* | 8/2015 | Juergens | G03F 7/70258 355/67 |

FOREIGN PATENT DOCUMENTS

| | | |
|---|---|---|
| WO | WO 2004/019128 | 3/2004 |
| WO | WO 2005/026843 A2 | 3/2005 |
| WO | WO 2005/069055 | 7/2005 |
| WO | WO 2011/120821 | 10/2011 |

OTHER PUBLICATIONS

International Search Report and Written Opinion for PCT/EP2014/051613, dated May 20, 2014.

* cited by examiner

PROJECTION LENS WITH WAVEFRONT MANIPULATOR

BACKGROUND

1. Technical Field

The invention relates to a projection lens for imaging a pattern arranged in an object plane of the projection lens into an image plane of the projection lens via electromagnetic radiation having an operating wavelength λ<260 nm, and to a projection exposure method which can be carried out with the aid of the projection lens.

2. Prior Art

Nowadays, predominantly microlithographic projection exposure methods are used for producing semiconductor components and other finely structured components, such as e.g. photolithography masks. This involves using masks (reticles) or other patterning devices which bear or form the pattern of a structure to be imaged, e.g. a line pattern of a layer of a semiconductor component. The pattern is positioned in a projection exposure apparatus between an illumination system and a projection lens in the region of an object plane of the projection lens and is illuminated with an illumination radiation provided by the illumination system. The radiation altered by the pattern passes as prediction radiation through the projection lens, which images the pattern on a reduced scale onto the substrate to be exposed. The surface of the substrate is arranged in the image plane of the projection lens, the image plane being optically conjugated with respect to the object plane. The substrate is generally coated with a radiation-sensitive layer (resist, photoresist).

One of the aims in the development of projection exposure apparatuses is to lithographically produce structures having increasingly smaller dimensions on the substrate. Smaller structures lead to higher integration densities e.g. in semiconductor components, which generally has an advantageous effect on the performance of the microstructured components produced.

The size of the structures that can be produced is crucially dependent on the resolution capability of the projection lens used and can be increased on the one hand by reducing the wavelength of the projection radiation used for the projection, and on the other hand by increasing the image-side numerical aperture NA of the projection lens that is used in the process.

High-resolution projection lenses nowadays operate at wavelengths of less than 260 nm in the deep ultraviolet range (DUV) or in the extreme ultraviolet range (EUV).

In order, at wavelengths from the deep ultraviolet range (DUV), to ensure sufficient correction of aberrations (e.g. chromatic aberrations, image field curvature), catadioptric projection lenses are usually used, which contain both transparent refractive optical elements having refractive power (lens elements) and reflective elements having refractive power, that is to say curved mirrors. Typically, at least one concave mirror is contained. Resolution capabilities that enable projection of structures having a size of 40 nm are achieved nowadays with immersion lithography at NA=1.35 and λ=193 nm.

Integrated circuits are produced by a sequence of photolithographic patterning steps (exposures) and subsequent process steps, such as etching and doping, on the substrate. The individual exposures are usually carried out with different masks or different patterns. In order that the finished circuit exhibits the desired function, it is necessary for the individual photolithographic exposure steps to be coordinated with one another as well as possible, with the result that the fabricated structures, for example contacts, lines and the constituents of diodes, transistors and other electrically functional units, come as close as possible to the ideal of the planned circuit layouts.

Fabrication faults can arise, inter alia, if the structures produced in successive exposure steps do not lie one on top of another sufficiently accurately, that is to say if the superimposition accuracy is not sufficient. The superimposition accuracy of structures from different fabrication steps of a photolithographic process is usually designated by the term "overlay". This term denotes e.g. the superimposition accuracy of two successive lithographic planes. Overlay is an important parameter in the fabrication of integrated circuits since alignment errors of any type can cause fabrication faults such as short circuits or missing connections and thus restrict the functioning of the circuit.

In multiple-exposure methods, too, stringent requirements are made of the superimposition accuracy of successive exposures. In the double-patterning method (or double-exposure method), for example, a substrate, for example a semiconductor wafer, is exposed twice in succession and the photoresist is then processed further. In a first exposure process, e.g. a normal structure having a suitable structure width is projected. For a second exposure process, a second mask is used, having a different mask structure. By way of example, periodic structures of the second mask can be displaced by half a period relative to periodic structures of the first mask. In the general case, particularly for more complex structures, the differences between the layouts of the two masks can be large. Double patterning makes it possible to achieve a reduction of the period of periodic structures on the substrate. This can be accomplished only if the superimposition accuracy of the successive exposures is good enough, that is to say if the overlay errors do not exceed a critical value.

Inadequate overlay can thus considerably reduce the yield of good parts during fabrication, as a result of which the fabrication costs per good part increase.

PROBLEM AND SOLUTION

The invention addresses the problem of providing a projection lens and a projection exposure method for microlithography which allow different photolithographic processes to be carried out with small overlay errors.

This problem is solved via a projection lens comprising the features of claim 1 and via a projection exposure method comprising the features of claim 13.

Advantageous developments are specified in the dependent claims. The wording of all of the claims is incorporated by reference in the content of the description.

The projection lens has a wavefront manipulation system for dynamically influencing the wavefront of the projection radiation passing from the object plane to the image plane of the projection lens. The effect of the components of the wavefront manipulation system which are arranged in the projection beam path can be set in a variable manner depending on control signals of a control device, as a result of which the wavefront of the projection radiation can be altered in a targeted manner. The optical effect of the wavefront manipulation system can be changed e.g. in the case of specific, previously defined causes or in a situation-dependent manner before an exposure or else during an exposure.

The wavefront manipulation system has a first manipulator, which has a first manipulator surface arranged in the projection beam path. The first manipulator includes a first actuating device, which allows the surface shape and/or the refractive index distribution of the first manipulator surface to be altered reversibly. As a result, the wavefront of the projection radiation which is influenced by the first manipulator surface can be dynamically altered in a targeted manner. This alteration of the optical effect is possible without the first manipulator being exchanged for another manipulator.

In this case, a manipulator surface is understood to mean a planar or curved surface which (i) is arranged in the projection beam path and (ii) in the case of which a change in its surface shape and/or its orientation with respect to the projection radiation leads to a change in the wavefront of the projection radiation. By way of example, any curved surface of a lens element that is displaceable relative to the other optical components of a projection lens is a manipulator surface. Further examples are mechanically or thermally deformable surfaces of lens elements or mirrors.

In the event of local, thermal manipulation of a lens element, generally the refractive index of the lens will also vary locally spatially. If—e.g. on account of the thickness of the lens element—it can be assumed that this variation has no component in the direction of the projection radiation, that is to say that the refractive index varies only orthogonally with respect to the direction of the projection radiation then it makes sense also to regard a local variation of the refractive index of a lens element as an effect which occurs at a manipulator surface. This applies to thin plane plates, for example.

In contrast to abovementioned known displacing, deforming or thermal manipulators which act on the wavefront for example via global displacement of an optical element, such as e.g. tilting, decentering and/or axially parallel displacement, or via global deformation, the first manipulator according to the claimed invention is configured in such a way that over an optically used region of the first manipulator surface within an effective diameter $D_{FP}$ of the first manipulator surface it is possible to generate a plurality of maxima and a plurality of minima of an optical path length change of the projection radiation. If $N_{MAX}$ is the number of maxima and $N_{MIN}$ is the number of minima of the optical path length change in the direction under consideration, then the effect of the first manipulator in the direction of the effective diameter can be described with the aid of a characteristic period $P_{CHAR}=D_{FP}((N_{MAX}+N_{MIN})/2)$. In this case, the multiple alternation of the optical path length change caused by the first manipulator over the influenced cross section of the projection radiation need not be strictly periodic, with the result that, for example, the absolute values of the maxima and/or of the minima of the optical path length change and/or the lateral distances thereof can vary over the cross section of the influenced projection radiation. Strictly periodic optical path length changes, which can be described for example by a sine function, are likewise possible.

The first manipulator surface is arranged "in optical proximity" to a closest field plane of the projection lens. This "near-field arrangement" means, inter alia, that the first manipulator surface is arranged significantly closer to the closest field plane than to a pupil plane of the projection lens. In this case, each beam emerging from a field point of the field plane at the first manipulator surface illuminates a subaperture having a subaperture diameter SAD that is significantly less than the maximum diameter $D_{FP}$ of the optically used region of the first manipulator surface, with the result that the condition $SAD/D_{FP}<0.2$ holds true. In particular, it is even possible for the condition $SAD/D_{FP}<0.1$ to hold true.

In this case, the subaperture diameter SAD should be understood to mean the diameter of the beam of projection light that emerges from an individual field point. The quotient $SAD/D_{FP}$ is generally independent of the height of the field point under consideration.

On account of the arrangement of the first manipulator surface in optical proximity to the closest field plane and the possibility of varying the optical effect over the beam cross section, the wavefront manipulator system is able to set or alter the distortion of the projection lens in the image field in a targeted manner in a field-dependent manner. This means, inter alia, that distortion values having different magnitudes can be set in a targeted manner for different field points. A wavefront manipulation system which is able to set a field-dependent distortion in a targeted manner depending on control signals allows a specific field-dependent distortion correction or distortion alteration to be introduced during each exposure process. As a result, it is also possible, in particular, to match the field-dependent distortion during a second exposure to a structure produced during a preceding first exposure such that the structures produced in successive exposure steps lie one on top of another with high superimposition accuracy. The superimposition accuracy, as a result of the activation of the manipulator, can be better than in the absence of an activated manipulator. As a result, overlay errors can be restricted to an extent that can be afforded tolerance.

This influencing of the field-dependent distortion should be obtained without other aberrations simultaneously being produced to a disturbing extent. Particular prominence is given here to eliminating or minimizing wavefront contributions having radially at least quadratic dependence in the pupil, i.e. focus terms and astigmatism terms.

Preferably, the projection lens has an effective object field lying outside the optical axis (off-axis field) and having an aspect ratio of greater than 2:1 between a longer side and a shorter side, wherein the optically used region has approximately a rectangular shape having an aspect ratio of greater than 2:1 and the first manipulator acts parallel to the longer side. In this direction, the first manipulator should be able to generate a plurality of maxima and a plurality of minima of the optical path length change of the projection radiation. The longer side can be used particularly simply for varying the path length change.

There are various possibilities for achieving the advantages of the novel wavefront manipulation system in practice.

In one embodiment, the wavefront manipulation system has only the first manipulator in optical proximity to the field plane and the finite first distance is dimensioned such that at the first manipulator surface upon activation of the first manipulator the condition $$0.25*NA_M^2 < SAD/P_{CHAR} < 0.48 \quad (1)$$

is fulfilled, wherein $NA_M$ is the numerical aperture of the projection radiation at the first manipulator surface.

Consequently, only one manipulator is provided here. As a result, the constructional design can be relatively simple and the structural space requirement can be small.

In order, with the use of only a single manipulator, to obtain the desired effect on the wavefront with sufficient intensity, without simultaneously producing undesirable residual aberrations to a disturbing extent, the first manipulator surface should be arranged neither too close to the closest field plane nor too far away from the closest field plane. An advantageous first distance is provided when condition (1) above is fulfilled. The parameter SAD stands for the subaperture diameter of the projection radiation at the first manipulator surface. This parameter takes account of the fact that each beam emerging from a field point of a field at the first manipulator surface illuminates a subaperture having a subaperture diameter SAD. The subaperture diameter can be understood as the diameter of the footprint of a single beam emerging from a field point at an optical surface. In the case of a divergent beam, in this case the subaperture diameter increases with increasing distance from the field.

It becomes clear from condition (1) indicated above that the subaperture diameter should be in a specific relation with respect to the characteristic period $P_{CHAR}$. In this application, the relation $SAD/P_{CHAR}$ is also designated as "normalized manipulator distance" and represented by the parameter $D_{NORM}:=SAD/P_{CHAR}$.

If the subaperture diameter SAD in the relation with respect to the characteristic period becomes too high, with the result that the upper limit is exceeded, then although generally it is possible to achieve a sufficiently great influence on the field dependence of the distortion, at the same time the level of normally undesirable aberrations, in particular the level of defocus and/or astigmatism, rises to an extent which can have a noticeably disturbing effect on the imaging. By contrast, if the lower limit is undershot, then although the level of undesirable aberrations, such as astigmatism, for example, can be kept low, at the same time normally the distortion can no longer be influenced in a field-dependent manner, to a sufficiently great extent, with the result that the effect of the first manipulator remains restricted to relatively low distortion values. Moreover, unfavorable contributions to the defocus budget can arise if the first manipulator surface lies too close to the field plane.

In some embodiments, the closest field plane is the object plane of the projection lens. It is particularly advantageous if no optical surface having refractive power is arranged between the object plane and the first manipulator surface, with the result that the numerical aperture $NA_M$ of the projection radiation at the first manipulator surface is equal to the object-side numerical aperture $NA_O$. Directly downstream of the mask pattern to be imaged, the effect of the manipulator cannot be disturbed by aberrations of intervening optical elements, with the result that the first manipulator can be used in a particularly targeted manner. Moreover, it can happen that there is no or no accessible intermediate image plane.

The manipulation of the distortion by a single manipulator can be difficult if, for example, the relatively small first distance then required with respect to a field plane can be realized only with difficulty on account of structural prerequisites. Moreover, the maximum effect of an individual manipulator is limited if demands for negligible higher-order contributions are to be fulfilled. For this reason, inter alia, some embodiments provide for the wavefront manipulation system to have in addition to the first manipulator a second manipulator, which has a second manipulator surface arranged in the projection beam path and a second actuating device for reversibly altering the surface shape and/or refractive index distribution of the second manipulator surface.

The two manipulators can preferably be set independently of one another.

With the use of at least two manipulators, this gives rise to larger ranges of suitable distances with respect to adjacent field planes, which can simplify the insertion of manipulators into the projection lens. Moreover, two or more manipulators can be operated jointly such that their desired effects with regard to the field-dependent distortion mutually amplify one another, while the undesired effects on other aberrations, such as e.g. defocus and/or astigmatism, can at least partly mutually compensate for one another.

Preferably, the first manipulator surface and the second manipulator surface are arranged in such a way that the numerical aperture of the projection radiation at the first manipulator surface is equal to the numerical aperture of the projection radiation at the second manipulator surface. For this purpose, no optical element having refractive power should be situated between the manipulator surfaces. What can thereby be achieved, inter alia, is that the adjustments of the manipulators (e.g. with regard to the characteristic period) can be coordinated with one another particularly simply.

It is also possible for a wavefront manipulation system to have more than two mutually independently drivable manipulators which are situated in near-field arrangement and the effects of which can be coordinated with one another, e.g. three or four manipulators.

If the projection lens is configured in such a way that between the object plane and the image plane at least one real intermediate image is generated in the region of an intermediate image plane, then the field plane closest to the first manipulator surface can also be the intermediate image plane.

In this case, the first manipulator surface can lie upstream of the intermediate image plane or downstream of the intermediate image plane in the radiation direction.

The numerical aperture at the location of the first manipulator surface is then dependent on the magnification scale with which the object is imaged into the corresponding intermediate image. In the case of demagnifying imaging between object and intermediate image, the numerical aperture in the vicinity of the intermediate image is greater than the object-side numerical aperture $NA_O$, with the result that the suitable first distances D1 are smaller than in the case of an arrangement in the vicinity of the object plane. By contrast, if magnifying imaging is present between object plane and intermediate image plane, the distance values with respect to the intermediate image plane that are suitable for fitting the first manipulator surface are increased. An arrangement in the vicinity of a real intermediate image can therefore be advantageous e.g. for reasons of structural space.

It can be particularly advantageous to arrange, in the vicinity of an intermediate image, two manipulators on different sides of the intermediate image. In one embodiment, the first manipulator surface is arranged upstream of the intermediate image plane and the second manipulator surface is arranged downstream of the intermediate image plane. The opposite arrangement is also possible. What can thereby be achieved, for example, is that the effects on the odd aberrations amplify one another, while in the case of the even aberrations, in particular defocus and astigmatism, the contributions of the two manipulators partly or completely mutually compensate for one another.

With the use of two manipulators on different sides of an intermediate image, it is possible to relax the distance requirements in comparison with the use of only a single manipulator. It has been found that the first distance and the second distance should then be dimensioned such that at the first manipulator surface (upon activation of the first manipulator) and also at the second manipulator surface (upon activation of the second manipulator) in each case the condition $$0.012 < SAD/P_{CHAR} < 0.85 \qquad (2)$$

is fulfilled. The permissible range for the normalized manipulator distance increases in comparison with condition (1). Moreover, the lower limit is no longer dependent on the numerical aperture of the projection radiation at the manipulator surface, with the result that this variant can be advantageous particularly in high-aperture regions of the projection beam path.

It is possible to arrange two manipulators directly successively on the same side of a field plane at different distances with respect to the latter. In one embodiment, the second manipulator surface is arranged directly downstream of the first manipulator surface, wherein the numerical aperture of the projection radiation at the first manipulator surface is equal to the numerical aperture of the projection radiation at the second manipulator surface and the first distance is less than the second distance, with the result that the subaperture diameters differ at the manipulator surfaces, wherein for the first manipulator surface the condition $$0.25 * NA_M^2 < SAD/P_{CHAR} < 0.8 \tag{3A}$$

holds true and for the second manipulator surface the condition $$SAD/P_{CHAR} < 1.5 \tag{3B}$$

holds true. In this case, although the first manipulator surface should not be moved closer to the field plane than when only a single manipulator is used (cf. condition (1)), the usable distance range is increased to greater distances that can still be afforded tolerance.

The invention can be used e.g. in the case of catadioptric projection lenses or dioptric projection lenses, if appropriate also in the case of other imaging systems.

The invention also relates to a projection exposure method for exposing a radiation-sensitive substrate arranged in the region of an image surface of a projection lens with at least one image of a mask pattern arranged in the region of an object surface of the projection lens, wherein a projection lens according to the invention is used.

Furthermore, the invention relates to a projection exposure apparatus for exposing a radiation-sensitive substrate arranged in the region of an image plane of a projection lens with at least one image of a mask pattern arranged in the region of an object plane of the projection lens, comprising: a primary radiation source for emitting primary radiation; an illumination system for receiving the primary radiation and for generating an illumination radiation that is directed onto the mask; and a projection lens for generating at least one image of the pattern in the region of the image surface of the projection lens, wherein the projection lens is designed according to the invention.

The projection exposure apparatus preferably has a central controller for controlling functions of the projection exposure apparatus, wherein the control device is assigned a control module for driving the wavefront manipulation system (WFM) and one manipulator or a plurality of manipulators can be driven via the control module e.g. via electrical signals in coordination with other control signals during the operation of the projection exposure apparatus.

The above features and further features are evident not only from the claims but also from the description and from the drawings, wherein the individual features can be realized in each case by themselves or as a plurality in the form of subcombinations in an embodiment of the invention and in other fields and constitute advantageous and inherently protectable embodiments. Exemplary embodiments of the invention are illustrated in the drawings and explained in greater detail below.

DETAILED DESCRIPTION OF THE PREFERRED EMBODIMENTS

Figure 1:
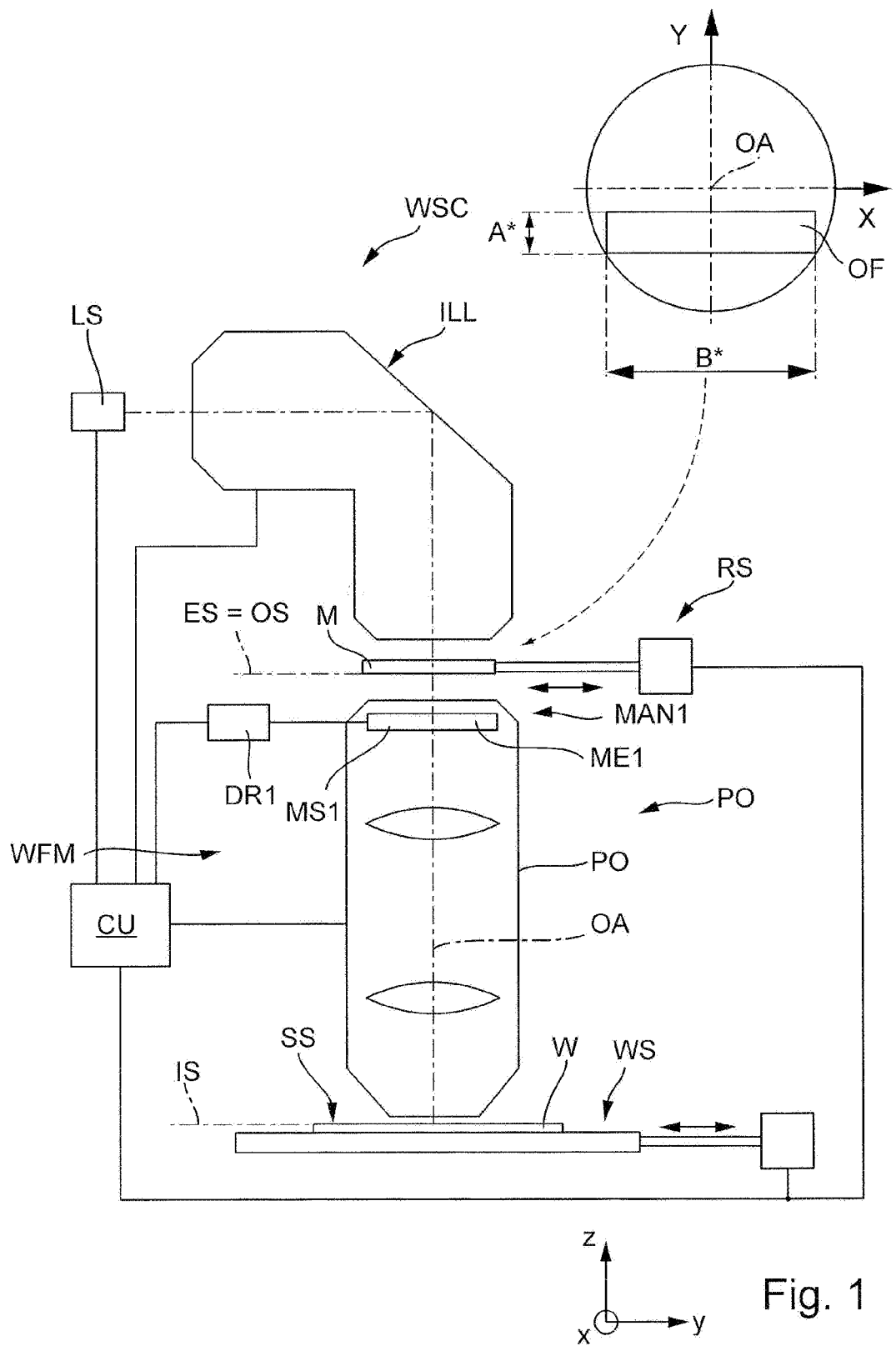
FIG. 1 shows a schematic illustration of a microlithography projection exposure apparatus in accordance with one embodiment of the invention.

FIG. 1 shows an example of a microlithographic projection exposure apparatus WSC which can be used in the production of semiconductor components and other finely structured components and operates with light or electromagnetic radiation from the deep ultraviolet range (DUV) in order to achieve resolutions down to fractions of micrometers. An ArF excimer laser having an operating wavelength $\lambda$ of approximately 193 nm serves as primary radiation source or light source LS. Other UV laser light sources, for example $F_2$ lasers having an operating wavelength of 157 nm or ArF excimer lasers having an operating wavelength of 248 nm, are likewise possible.

An illumination system ILL disposed downstream of the light source LS generates in its exit surface ES a large, sharply delimited and substantially homogeneously illuminated illumination field adapted to the telecentricity requirements of the projection lens PO arranged downstream thereof in the light path. The illumination system ILL has devices for setting different illumination modes (illumination settings, and can be changed over for example between conventional on-axis illumination with a varying degree of coherence $\sigma$ and off-axis illumination. The off-axis illumination modes comprise, for example, annular illumination or dipole illumination or quadrupole illumination or some other multipolar illumination. The construction of suitable illumination systems is known per se and will therefore not be explained in greater detail here. The patent application US 2007/0165202 A1 (corresponding to WO 2005/026843 A2) discloses examples of illumination systems which can be used in the context of various embodiments.

Those optical components which receive the light from the laser LS and form from the light illumination radiation which is directed onto the reticle M belong to the illumination system ILL of the projection exposure apparatus.

A device RS for holding and manipulating the mask M (reticle) is arranged downstream of the illumination system such that the pattern arranged on the reticle lies in the object plane OS of the projection lens PO, which plane coincides with the exit plane ES of the illumination system and is also designated here as reticle plane OS. The mask is movable in this plane for scanner operation in a scanning direction (y-direction) perpendicular to the optical axis OA (z-direction) with the aid of a scan drive.

Downstream of the reticle plane OS there follows the projection lens PO, which acts as a reducing lens and images an image of the pattern arranged on the mask M on a reduced scale, for example on the scale 1:4 ($|\beta|=0.25$) or 1:5 ($|\beta|=0.20$), onto a substrate W coated with a photoresist layer, the light-sensitive substrate surface SS of the substrate lying in the region of the image plane IS of the projection lens PO.

The substrate to be exposed, which is a semiconductor wafer W in the case of the example, is held by a device WS comprising a scanner drive in order to move the wafer synchronously with the reticle M perpendicular to the optical axis OA in a scanning direction (y-direction). The device WS, which is also designated as "wafer stage", and the device RS, which is also designated as "reticle stage", are part of a scanner device controlled via a scanning control device, which in the embodiment is integrated into the central control device CU of the projection exposure apparatus.

The illumination field generated by the illumination system ILL defines the effective object field OF used during the projection exposure. The object field is rectangular in the case of the example and has a height $A^*$ measured parallel to the scanning direction (y-direction), and a width $B^*>A^*$ measured perpendicularly thereto (in the x-direction). The aspect ratio $AR=B^*/A^*$ is generally between 2 and 10, in particular between 3 and 6. The effective object field lies at a distance in the y-direction alongside the optical axis (off-axis field). The effective image field in the image surface IS, the image field being optically conjugate with respect to the effective object field, has the same shape and the same aspect ratio between height B and width A as the effective object field, but the absolute field size is reduced by the imaging scale B of the projection lens, i.e. $A=|\beta|A^*$ and $B=|\beta|B^*$.

If the projection lens is designed and operated as an immersion lens, then during the operation of the projection lens radiation passes through a thin layer of an immersion liquid situated between the exit surface of the projection lens and the image plane IS. Image-side numerical apertures $NA>1$ are possible during immersion operation. A configuration as a dry lens is also possible; here the image-side numerical aperture is restricted to values of $NA<1$. Under these conditions which are typical of high-resolution projection lenses, projection radiation having a relatively large numerical aperture, e.g. having values of greater than 0.15 or greater than 0.2 or greater than 0.3, is present in the region of some or all field planes (object plane, image plane, possibly one or more intermediate image planes) of the projection lens.

The projection lens or the projection exposure apparatus is equipped with a wavefront manipulation system WFM, which is configured for dynamically altering the wavefront of the projection radiation passing from the object plane OS to the image plane IS in the sense that the optical effect of the wavefront manipulation system can be set in a variable manner via control signals. The wavefront manipulation system in the exemplary embodiment comprises a first manipulator MAN1 having a first manipulator element ME1, which is arranged in direct proximity to the object plane of the projection lens in the projection beam path and has a first manipulator surface MS1, which is arranged in the projection beam path and the surface shape and/or refractive index distribution of which can be reversibly altered with the aid of a first actuating device DR1.

Figure 2:
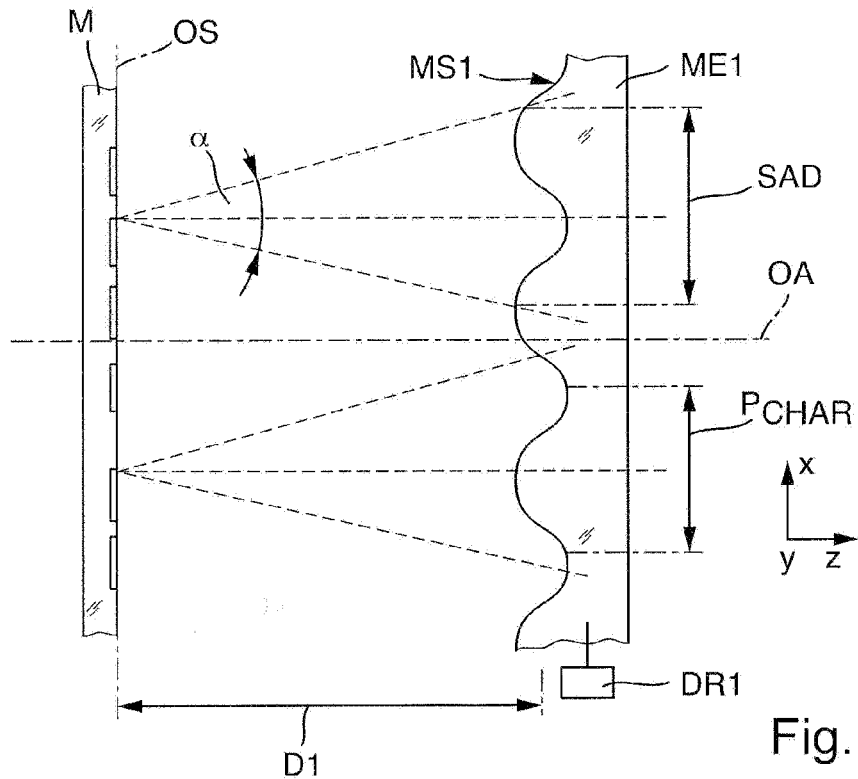
FIG. 2 shows a schematic longitudinal section in an x-z plane in the region of the mask and of a directly succeeding first manipulator element.

For further elucidation, FIG. 2 shows a schematic longitudinal section in an x-z plane in the region of the mask M and of the directly succeeding first manipulator element ME1.

The first manipulator element ME1 is a plate-shaped optical element composed of a material which is transparent to the projection radiation, for example composed of synthetic fused silica. A light entrance side facing the object plane OS serves as first manipulator surface MS1, and the opposite light exit surface is a planar surface.

The first actuating device comprises a multiplicity of mutually independently drivable actuators (not illustrated) which act on the plate-shaped manipulator element ME1 in such a way that the surface shape of the first manipulator surface MS1 can be brought to a wave shape in a defined manner. In this case, both the "amplitude" of the waves measured parallel to the z-direction, i.e. the deflection of the manipulator surface in the z-direction, and the distance between adjacent wave peaks measured in the x-direction, i.e. the wavelength or the period of the wave pattern, can be set to different values. In the case of the example, in the x-direction a sine-wave-shaped profile is set, the (average) wavelength of which in the x-direction can be characterized by a characteristic period $P_{CHAR}$.

Figure 3:
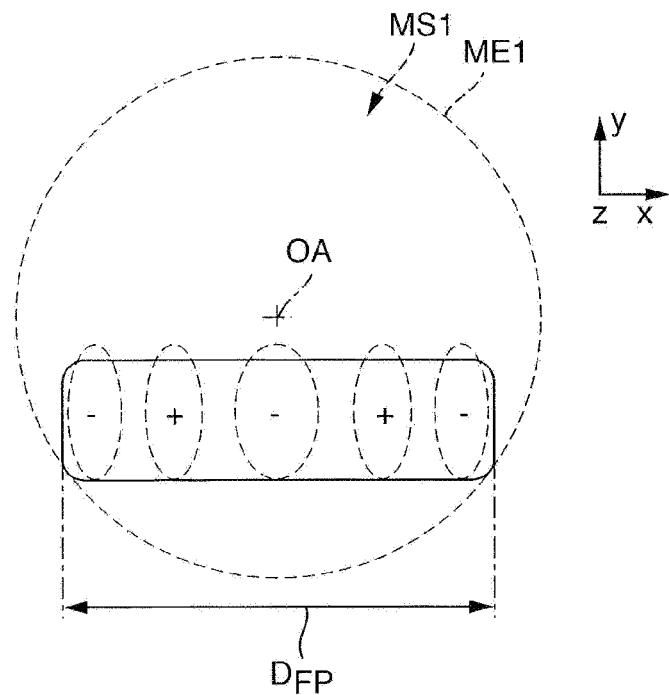
FIG. 3 shows a plan view of the first manipulator element in FIG. 2 parallel to the optical axis.

The first manipulator surface is arranged at a finite first distance D1 from the object plane OS of the projection lens, the object plane being the closest field plane to the first manipulator surface. The first manipulator surface MS1, from an optical standpoint, is arranged in direct proximity to the object plane OS, that is to say in a "near-field position". This can be discerned from FIG. 3, inter alia. FIG. 3 shows a plan view of the first manipulator surface MS1 or the first manipulator element ME1 parallel to the optical axis OA (in the z-direction). The rectangular region FP, having rounded corners in this case represents that region of the first manipulator surface which is illuminated by the rays coming from the effective object field OF. This region is also designated as "footprint".

In this case, the footprint of the projection radiation represents in size and shape the intersection area between the projection beam and the area (here first manipulator surface MS1), through which the projection beam passes. The optical proximity to the object plane OS can be discerned from the fact that the footprint substantially has the rectangular shape of the object field OF, the corner regions being somewhat rounded. Moreover, the footprint exactly like the object field lies outside the optical axis OA. While the optical region used by the protection radiation in optical proximity to the field substantially has the shape of the illuminated field region, a substantially circular region is illuminated in the region of the pupil plane Fourier-transformed with respect to a field plane, with the result that a footprint has an at least approximately circular shape in the region of a pupil.

The region illuminated at the first manipulator surface MS1, has an effective diameter $D_{FP}$ in the x-direction. FIGS. 2 and 3 schematically show that the surface shape of the first manipulator surface in this direction has a plurality of local maxima (represented by wave peaks in FIG. 2 and by "+" symbols in FIG. 3) and a plurality of intervening local minima (represented by wave valleys and "−" symbols in FIG. 3). Consequently, this results in a "waviness" in the x-direction or in the direction of the effective diameter.

In the case of a projection lens, a beam emerges from each field point of the object plane, the diameter of the beam increasing with increasing distance from the object plane. In this case, the object-side numerical aperture $NA_O$ corresponds to the sine of the aperture angle $\alpha$ of each of the beams. Each beam emerging from a field point illuminates at the first manipulator surface MS1 a circular subaperture, the diameter of which is designated as the subaperture diameter SAD. It is directly evident from FIG. 2 that the subaperture diameter SAD increases as the first distance D1 increases and as the image-side numerical aperture increases. The first manipulator is arranged so close to the object plane that a plurality of subapertures fit into the illuminated region FP alongside one another without mutual overlap in the x-direction. Preferably, the condition $SAD/D_{FP}<0.2$ should be fulfilled, in particular even the condition $SAD/D_{FP}<0.1$.

If these conditions are met, then it is possible, with the aid of the dynamic first manipulator, to influence the distortion in the image field of the projection lens in a location-dependent manner such that a field-dependent distortion correction becomes possible. This is achieved by virtue of the fact that the first manipulator is able to introduce different changes in the optical path length for beams which emerge from different field points. The change in the optical path length, which is also designated for short as optical path length change, shall be designated here by the parameter $\Delta OPL$.

There are various causes of a change in the optical path length of a ray upon passing through a transparent optical element composed of a material having a refractive index n and a thickness d through which radiation is transmitted. If $\Delta d$ is the change in the thickness d of the optical element through which radiation is transmitted in the z-direction, then $\Delta OPL=\Delta d*n-1$ holds true in the case of perpendicular transmission of radiation. If, in the optical element through which radiation is transmitted, a refractive index change $\Delta n$ arises e.g. on account of heating or cooling, then $\Delta OPL=\Delta n*d$ holds true. These causes can take effect alternatively or cumulatively. Often, one cause is dominant. Both effects can be used in the context of the invention.

In the example in FIG. 2, a first beam emerges from the first field point FP1, the chief ray (dashed line) of which beam, such chief ray running parallel to the optical axis, impinges in the region of a "wave valley", that is to say in the region of a local minimum of the plate thickness. In the case of a second beam shown by way of example, which emerges from a second field point FP2 offset laterally with respect to the first field point, the chief ray (illustrated in a dashed line) impinges in the region of a wave peak, i.e. in the region of a local maximum of the plate thickness. The beams emerging from the two field points thus experience different changes in the optical path length.

The local distribution of the optical path length changes in the x-direction is variable via the driving of the actuating devices of the first manipulator such that a differently deformed surface shape having different waviness can be set, with the result that the field dependence of the wavefront correction can also be set. In this case, the form and intensity of the wavefront change depend on the profile of the optical path length change by the first manipulator surface MS1 within the subaperture associated with the beam. A linear rise or fall of the optical path length change over the subaperture diameter leads to a tilt of the wavefront, for example, and a quadratic profile leads to the influencing of focus and astigmatism.

With reference to FIGS. 4 to 8, an explanation will now be given of the effects of a first manipulator element positioned in a near-field arrangement on the correction state of the wavefront in the image field IF of the projection lens as a function of various influencing parameters. In the field of geometrical optics, Zernike polynomials are usually used to represent wavefronts that in turn describe the imaging aberrations of optical systems. In this case, the individual imaging aberrations can be described by the coefficients of the Zernike polynomials, that is to say the Zernike coefficients or the values thereof (in [nm]). In the representation chosen here, the Zernike coefficients Z2 and Z3 represent the tilting of a wavefront in the x-direction and y-direction, respectively, as a result of which a distortion-like aberration arises. The Zernike coefficient Z4 describes a curvature of the wavefront, whereby a defocus error can be described. The Zernike coefficient Z5 describes a saddle-shaped deformation of the wavefront and thus the astigmatism component of a wavefront deformation. The Zernike coefficients Z7 and Z8 represent coma, the Zernike coefficient Z9 represents spherical aberration, and the Zernike coefficients Z10 and Z11 represent three leaf clover.

With reference to FIGS. 4 to 8, a description will be given firstly of an example of a wavefront manipulation system which has only a single first manipulator having a first manipulator surface, which is arranged in optical proximity to the object plane. FIGS. 4 to 7 in this case illustrate the sensitivities of such a manipulator as a function of the axial position, i.e. as a function of the distance from the closest field plane. In this case, the term "sensitivity" denotes the effect of the manipulator on the wavefront in the case of a defined "deflection" of the manipulator, wherein the "deflection" can be given for example by a maximum optical path length change $\Delta OPL=1$ nm.

Figure 4:
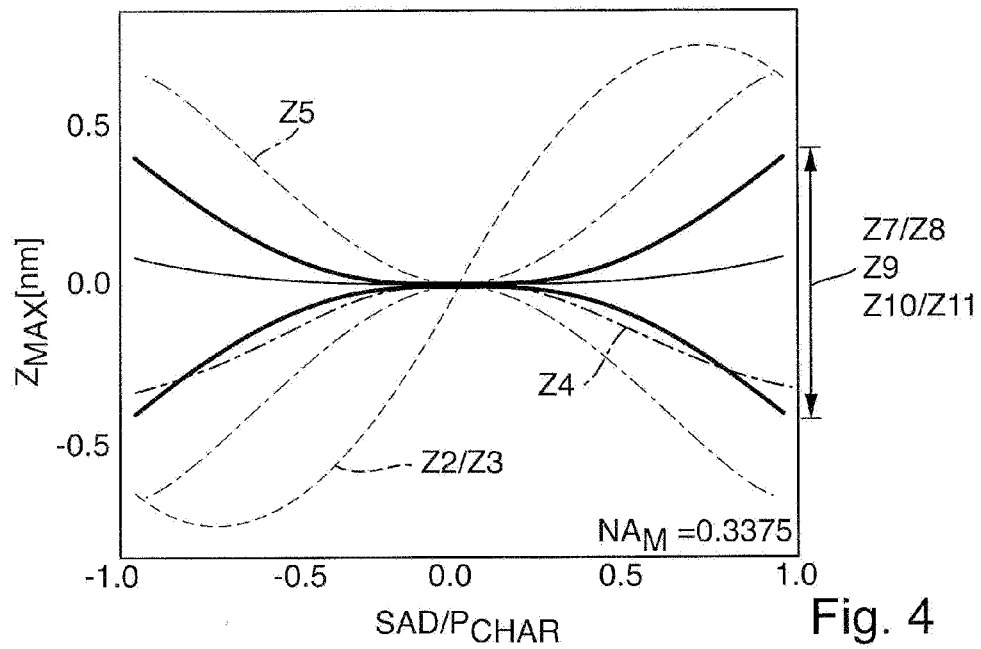
FIGS. 4 to 8 illustrate effects of a first manipulator element positioned in a near-field arrangement on the correction state of the wavefront in the image field of a projection lens as a function of various influencing parameters.
Figure 5:
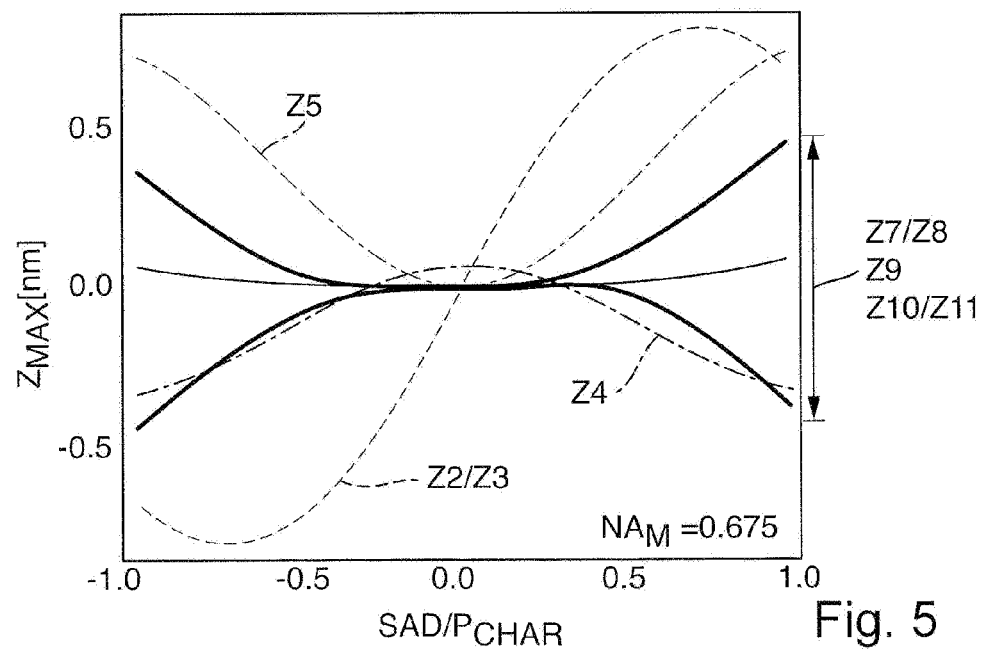

In FIGS. 4 to 7, here the "normalized manipulator distance" $D_{NORM}$ from the closest field plane, that is to say the relation $SAD/P_{CHAR}$, is in each case indicated on the x-axis. A value $SAD/P_{CHAR}=0.0$ represents a position directly in the field plane. Positive values represent a positioning downstream of the field plane in the direction of transmission of radiation, and negative values represent positions upstream of the field plane. The value $Z_{MAX}$ of the respective Zernike coefficients in the form of the maximum value over the field considered (in [nm]), is in each case plotted on the y-axis. FIG. 4 shows the values for $NA_M=0.3375$, while FIG. 5 shows the corresponding values for $NA_M=0.675$. The numerical aperture of the projection radiation at the first manipulator surface in the case of FIG. 5 is therefore double the magnitude of that in the case of FIG. 4.

It is evident that the effect on the distortion aberration (Z2/3), is an odd function in the sense that the effect in the case of positioning upstream of the field plane and the effect in the case of positioning downstream of the field plane have opposite signs. The sensitivity curve of Z2/3 has a point of inflection at the field plane. By contrast, the sensitivities for defocus (Z4) and astigmatism (Z5) are even functions in the sense that their profile is mirror-symmetrical with respect to the field plane and has a local extremum (maximum in the case of defocus, minimum in the case of astigmatism), in the field plane. Moreover, the astigmatism term and the distortion term vanishes in the field plane, while the defocus term Z4 has a local maximum directly in the field plane and vanishes only at a certain distance outside the field plane. (The solid lines represent higher-order aberrations, namely coma (Z7/8), spherical aberration (Z9) and three leaf clover (Z10/11). These will initially not be taken into consideration here). The relations in the case of a higher numerical aperture (FIG. 5) are similar, wherein it is evident that the extent of the defocus term increases with increasing numerical aperture at the manipulator surface.

In the case of the example, the first manipulator is intended to be used to influence distortion aberrations in a field-dependent manner. The distortion aberrations are also described by the values Z3, which thus represents that aberration which is intended to be influenced, i.e. the "desired aberration". The other aberrations in particular Z4 (defocus) and Z5 (astigmatism), are intended as far as possible not to be influenced, or to be influenced only to such a small extent that the resulting aberrations are of a regularly negligible order of magnitude.

Figure 6:
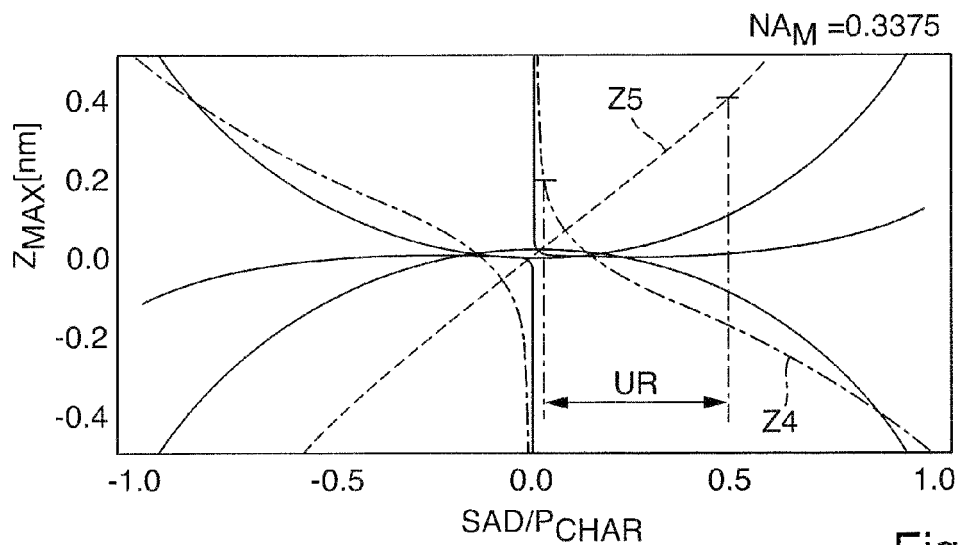
Figure 7:
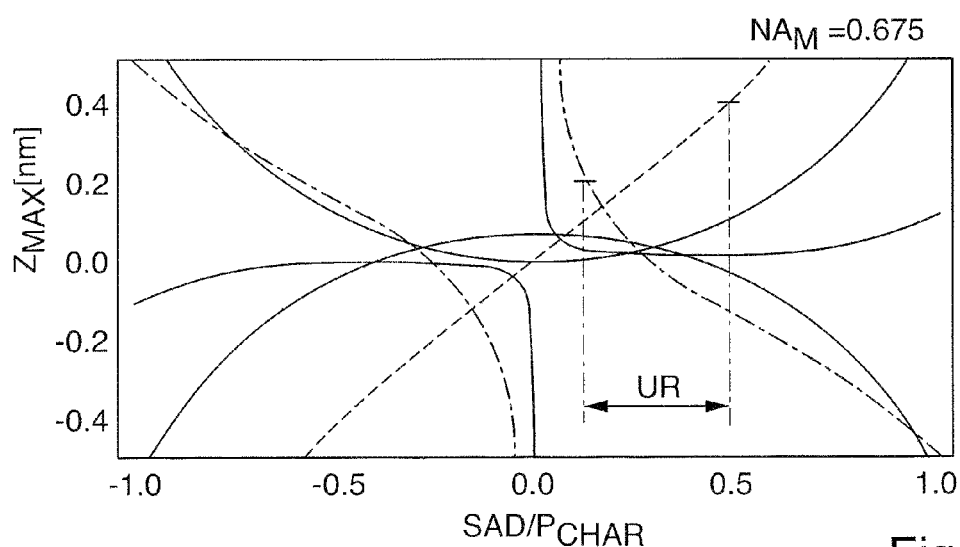

In order to clarify how the positioning of the manipulator surface affects the desired aberrations (Z2, Z3), on the one hand, and the undesired residual aberrations (Z4, Z5, etc.), on the other hand, in FIGS. 6 and 7 the values corresponding to FIGS. 4 and 5 are plotted again in such a way that the sensitivities are plotted as normalized values relative to a Z3 sensitivity of 1 nm on the y-axis. This plotting reveals what "price" (in terms of here undesired residual aberrations) has to be paid in order to produce a (desired) distortion correction of the order of magnitude of maximally 1 nm Z3.

In this normalized plotting it is evident that with a finite distance from the field plane there is a distance range UR (useful range) of finite width in which both the defocus term and the astigmatism term remain below the limits regarded as critical for these aberration contributions. If it is assumed, for example, that, in the case of a distortion contribution of Z2=1 nm that is maximally to be set, the absolute value of the defocus term Z4 is intended not to be greater than 0.2 nm, then it is evident that the first manipulator surface in this case should not be brought closer to the field plane than at a normalized manipulator distance value $D_{NORM}$=0.03. If the first manipulator surface is brought closer to the field plane than this limit value, then a very great rise in the defocus contribution results on account of a singularity of the defocus term at this location. Toward greater distances, the readily useful distance range UR is limited by the contributions to the astigmatism. It is typically assumed in this application that astigmatism terms of less than 0.4 nm can be afforded tolerance in most cases, while the astigmatism contribution (Z5) should not be higher than this limit value. The limit value Z5=0.4 nm is associated with a normalized manipulator distance $D_{NORM}$=approximately 0.48.

These limits result from FIG. 6 for a value $N_{AM}$=0.3375. A corresponding plotting for a numerical aperture of double the magnitude at the first manipulator surface is plotted in FIG. 7. A corresponding evaluation of the useful distance range UR shows that a larger normalized manipulator distance with respect to the field plane should now be complied with on account of the greater rise in the defocus term in the vicinity of the field plane, the lower limit of the normalized manipulator distance now being approximately $D_{NORM}$=0.12. The upper limit governed by the astigmatism term is independent of the numerical aperture at the manipulator surface.

Figure 8:
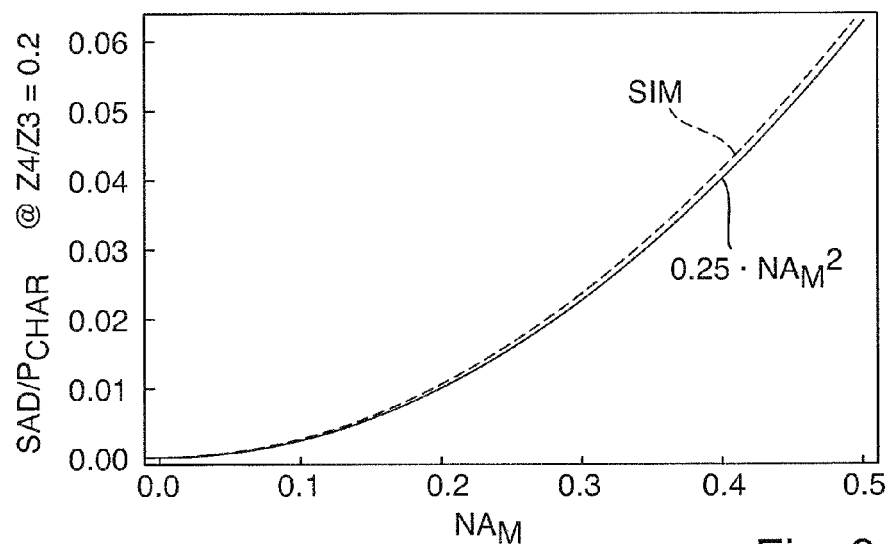

A more precise analysis shows that the lower limit of the useful distance range in the case of a predefined upper limit value for the defocus contribution to a good approximation scales with the square of the numerical aperture at the manipulator surface. In this respect, FIG. 8 shows a diagram showing on the x-axis the numerical aperture $N_{AM}$ of a manipulator surface and on the y-axis the normalized manipulator distance $D_{NORM}$ for a predefined limit value of the defocus term where Z4/Z3=0.2. The dashed line here shows in each case the results of the simulations described in the previous figures; the solid line is given by $0.25*NA_M^2$.

Consequently, if a single dynamically manipulatable manipulator surface situated in a near-field arrangement is used, then the useful distance range of the normalized manipulator distance for a well functioning manipulator results from the following inequality:

$$0.25*NA_M^2 < SAD/P_{CHAR} < 0.48 \quad (1)$$

In this case, the upper limit is determined by the ratio Z5/Z3=0.4. The corresponding value $SAD/P_{CHAR}$>0.48 is independent of $NA_M$. The NA-dependent lower limit is given by $0.25 NA_M^2$.

A description is given below, by way of example, of wavefront manipulation systems having a plurality of manipulators that can be operated independently of one another. For clarity of illustration, examples will be explained in which, in addition to the first manipulator, exactly one second manipulator is provided, which has a second manipulator element having a second manipulator surface arranged in the projection beam path and a second actuating device for reversibly altering the surface shape and/or refractive index distribution of the second manipulator surface. A wavefront manipulation system can also comprise more than two manipulators which can be set independently of one another, for example three or four manipulators.

Figure 9:
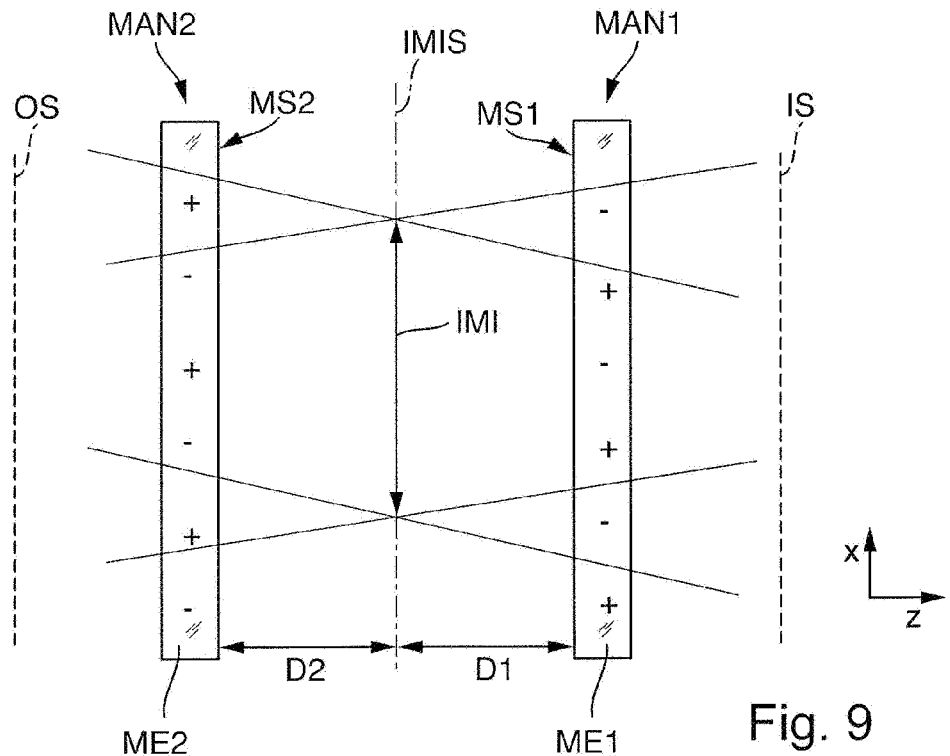
FIG. 9 schematically shows elements of a wavefront manipulation system which has manipulator elements upstream and downstream of an intermediate image plane.

In the case of the exemplary embodiment in FIG. 9, the projection lens is configured such that an intermediate image plane IMIS lies between the object plane OS and the image plane IS, a real intermediate image IMI being generated in the intermediate image plane. For this purpose, the projection lens has between the object plane OS and the intermediate image plane IMIS a plurality of optical elements which jointly form an optical imaging system, which forms a first lens part of the projection lens. Depending on the design of the first lens part, the intermediate image can be magnified or reduced relative to the effective object field situated in the object plane OS, or can have the same size as the object field. The intermediate image is imaged directly or via at least one further intermediate image into the image plane IS, typically with a greatly reduced imaging scale.

The wavefront manipulation system has a first manipulator MAN1 having a first manipulator element ME1, the first manipulator surface MS1 of which is arranged at a first distance D1 downstream of the intermediate image plane, that is to say between the latter and the image plane. A second manipulator MAN2 has a second manipulator element ME2 having a second manipulator surface MS1, which is arranged at a finite second distance D2 upstream of the intermediate image plane, that is to say between the latter and the object plane. An arrangement with identical distances D1=D2 that is symmetrical with respect to the intermediate image plane is advantageous because the undesired even aberrations can then be completely compensated for. The plate-shaped manipulator elements are in each case situated in a near-field arrangement with respect to the intermediate image plane, with the result that the condition $SAD/D_{FP}$<0.2 holds true for the respective manipulator surfaces.

Each of the manipulator elements can be driven such that a multiple alternation of the effect on the change in the optical path length can be generated in the x-direction. The patterns for setting the optical path length changes ΔOPL are the inverse of one another. That is symbolized by the symbols "+" and "−", where "+" represents a local maximum and "−" represents a local minimum of the optical path length changes ΔOPL. What can thus be achieved is that the contributions produced by the two manipulators to the even aberrations, such as defocus and astigmatism, for example, mutually compensate for one another, with the result that the combination of the two manipulators practically produces no contributions to defocus and astigmatism.

Figure 10:
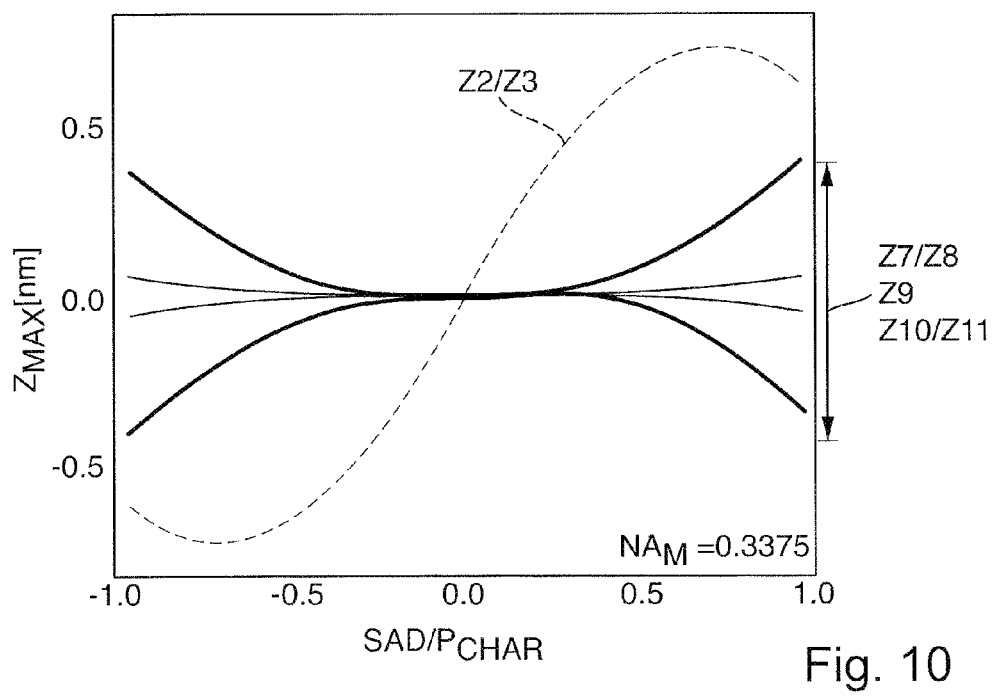
FIG. 10 shows, analogously to the illustrations in FIGS. 4 and 5, the dependence of different Zernike coefficients on the normalized manipulator distance on both sides of an intermediate image plane.

In this respect, FIG. 10 shows, analogously to the illustrations in FIGS. 4 and 5, the dependence of various Zernike coefficients on the normalized manipulator distance $D_{NORM}$ on both sides of the intermediate image plane in the case of $SAD/P_{CHAR}$=0. The values are calculated for $NA_M$=0.3375.

Since the contributions to defocus and astigmatism in the case of opposite driving and identical distances with respect to the intermediate image plane can cancel one another out, larger useful distance ranges than in the case of only a single manipulator arise upstream and downstream of the intermediate image plane. A certain minimum distance between the respective manipulator surfaces and the intermediate image plane is necessary in order to obtain a sufficiently high sensitivity of the manipulators for the aberrations to be manipulated (Z2/3), without deforming or loading the manipulators to an excessively great extent. If a desired correction range for these aberrations of the order of magnitude of 2 nm is assumed and if a correction range up to 50 nm is sought as maximum permissible deformation per manipulator surface, then the condition SAD/$P_{CHAR}$>0.012 results as the condition for the lower limit of the normalized manipulator distance. The upper limit of the useful distance range can expediently be described by the condition SAD/$P_{CHAR}$<0.85, if the intention is to avoid excessively large contributions for coma and three leaf clover. Consequently, the following preferably holds true:

$$0.012 < SAD/P_{CHAR} < 0.85 \quad (2)$$

Figure 11:
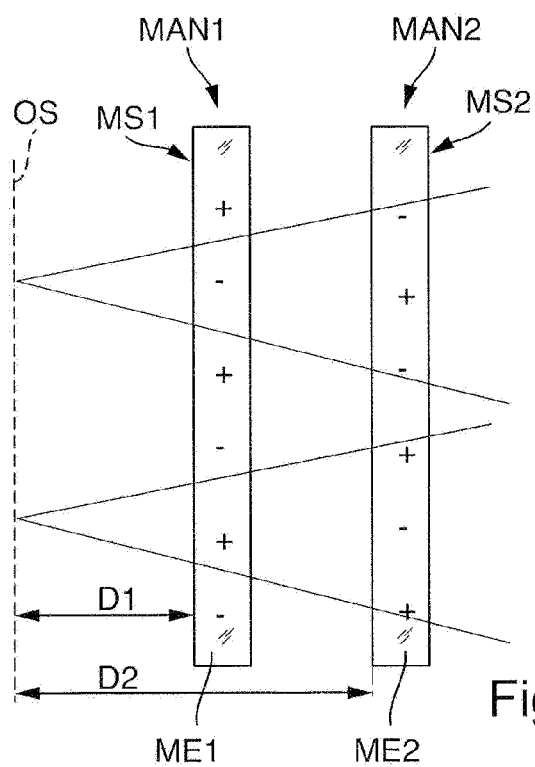
FIG. 11 schematically shows elements of a wavefront manipulation system which has two closely adjacent manipulator elements downstream of a field plane.

There are further possibilities for configuring a wavefront manipulation system having two manipulators that can be operated independently of one another in the projection beam path. In this respect, FIG. 11 shows a schematic illustration of an exemplary embodiment in which the wavefront manipulation system has two manipulators MAN1, MAN2, which are arranged one directly behind the other at different distances from a field plane (here object plane OS) of the projection lens, which field plane is arranged upstream thereof in the direction of transmission of radiation. The first and second manipulator elements ME1, ME2, which are of substantially plate-shaped design, are arranged one directly behind the other without the interposition of an optical element having refractive power in the diversion beam path such that the numerical aperture of the projection radiation at both manipulator surfaces (first manipulator surface MS1, second manipulator surface MS2) is the same. The first manipulator element is closer to the closest field plane OS, with the result that the first distance D1 is less than the second distance D2.

On account of the different distances with respect to the field points from which beams respectively emerge, the sub-aperture diameters are in each case smaller at the first manipulator surface than at the second manipulator surface. This leads to different sensitivities with regard to the target variable to be altered (here distortion Z2/3) and with regard to the remaining undesired aberrations. What can be achieved via suitable driving of the two manipulators is that, with the same effect on the target variable, the undesired aberrations are reduced in comparison with the case of only one manipulator (see FIG. 2).

This results in more relaxed distance requirements for the positioning of the manipulator elements, wherein it is possible, in particular, to arrange a manipulator element further away from the field plane than in the case of only a single manipulator element.

The analyses explained in greater detail below have shown that the first manipulator lying closer to the field plane should not lie closer to the field plane than in the case of only a single manipulator, in order to obtain for this manipulator a good compromise between sufficiently high sensitivity and sufficiently small contributions to the undesired aberrations. In this case, the normalized manipulator distance should, if possible, not be less than 0.25*$NA_m^2$. However, it is possible to arrange the first manipulator surface further away from the field plane than in the case of a single manipulator. Under corresponding boundary conditions, an upper limit of 0.8 for the normalized manipulator distance appears to be practical. The second manipulator surface can lie significantly further away from the closest field plane, wherein the normalized manipulator distance should preferably be less than 1.5.

Figure 12:
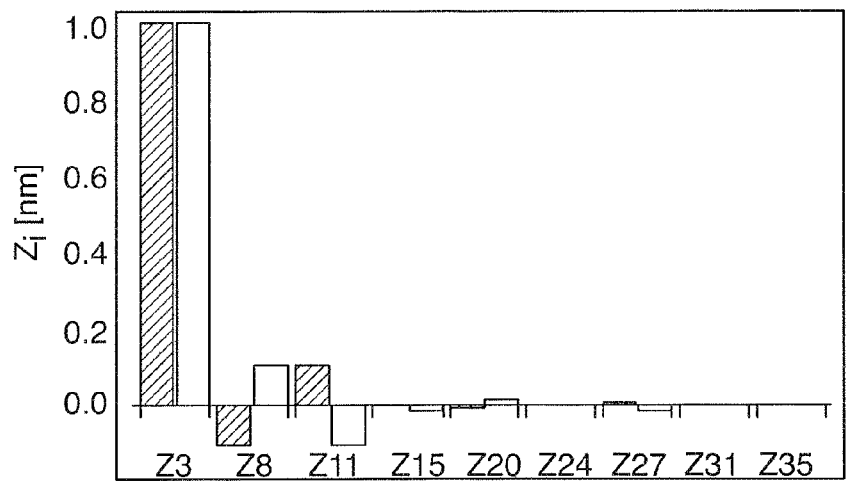
FIGS. 12 to 15 in each case show bar diagrams for elucidating the effects of manipulations on selected aberrations, wherein the height of the bars in each case indicates the contributions to the individual aberrations indicated on the x-axis (represented by Zernike coefficients)
Figure 13:
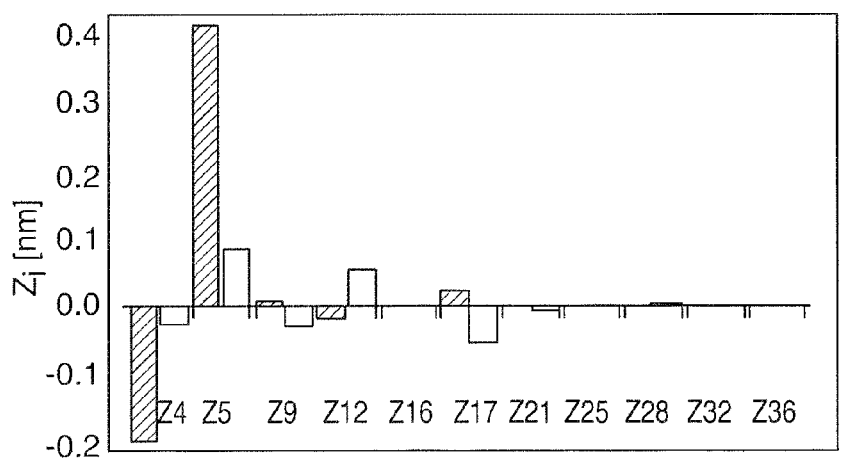

For elucidating the effects on the aberrations, FIGS. 12 to 15 in each case show bar diagrams, wherein the height of the bars in each case represents the contributions to the individual aberrations $Z_i$ [nm] indicated on the x-axis. The first example is illustrated in FIGS. 12 and 13. The bars respectively on the left having a darker gray shade represent a reference case, wherein only a single manipulator is arranged at a normalized manipulator distance SAD/$P_{CHAR}$=0.5 from the closest field plane. The bars respectively on the right having a lighter gray shade represent an exemplary situation with two directly successive manipulator elements, wherein the first manipulator element, closer to the field plane, has the same normalized manipulator distance (0.5) from the closest field plane, while the manipulator element further away is arranged at SAD/$P_{CHAR}$=0.7. The bar heights in all the diagrams are normalized to a value of 1 nm of the desired aberration Z3. This means that the manipulator is driven such that it yields a contribution of 1 nm to the tilt of the wavefront.

Consideration will firstly be given only to the darker bars in FIGS. 12 and 13, which illustrate the situation for a single manipulator. It is evident that a desirable contribution to the distortion correction of the order of magnitude of 1 nm Z3 generates various undesired aberrations, wherein the defocus (Z4) and the astigmatism (Z5) are the dominant residual aberrations. This corresponds to the situation that has already been explained in connection with FIG. 6.

If, by contrast, in addition to the first manipulator at SAD/$P_{CHAR}$=0.5, a second manipulator is also disposed directly downstream at SAD/$P_{CHAR}$=0.7, the residual aberrations, in particular in the case of defocus (Z4) and astigmatism (Z5) can be considerably reduced. With the same sensitivity for the aberration sought (Z3), the contribution to the defocus is reduced from approximately −0.18 to approximately −0.03. For the astigmatism (Z5), a reduction to approximately ¼ of the comparative value results, namely from 0.4 to approximately 0.09. The combination of two manipulators disposed one directly behind the other thus results in significantly smaller contributions to defocus and astigmatism than in the case of an individual manipulator arranged at a comparable distance from the closest field plane.

Figure 14:
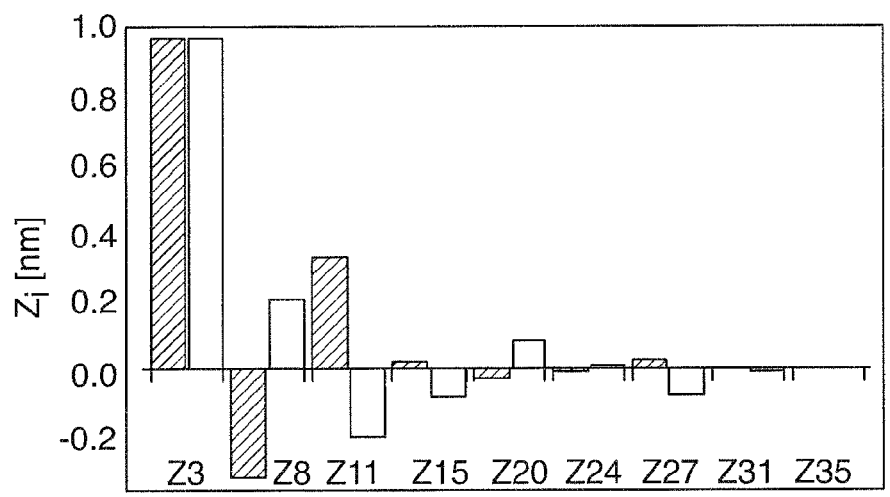
Figure 15:
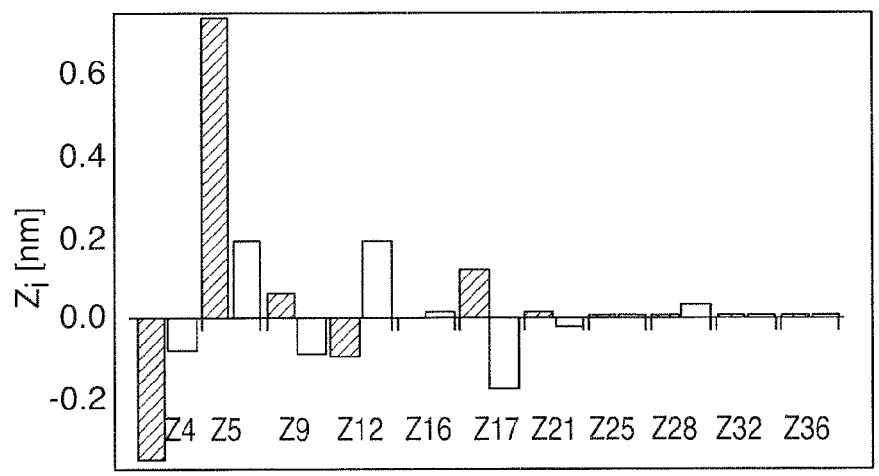

In order to assess a practicable upper limit for the distances with respect to the closest field plane, FIGS. 14 and 15 show in a corresponding plotting the aberration contributions for a case in which the first manipulator element, lying closer to the field plane, is arranged at a normalized manipulator distance SAD/$P_{CHAR}$=0.8 and the second manipulator element, situated further away, is arranged at SAD/$P_{CHAR}$=1.0. The darker left bars in each case show the aberration contributions for the case where only the first manipulator element situated closest is used. The lighter bars show the corresponding results in the case of inverse driving of the two manipulator elements arranged one directly behind the other. It is evident that the individual manipulator element in the case of a desired sensitivity Z3=1 nm both in the case of defocus (Z4) and in the case of astigmatism (Z5) yields contributions which are greater than the upper limit values assumed to be able to be afforded tolerance here (Z4=0.2 nm and Z5=0.4 nm). The combination of two manipulators can reduce these contributions to such a significant extent that the contribution to defocus (now approximately −0.08) and astigmatism (now approximately 0.2), lie below the upper limit values assumed here, with the result that disturbing aberrations of this type are no longer produced. The odd aberrations, such as coma (Z8) and three leaf clover (Z11), still just lie in a range that can be afforded tolerance of the order of magnitude of in each case approximately 0.3 nm. This example shows that the upper distance limits indicated here should not be exceeded if the contributions to odd aberrations ought not to become too high. Overall, it is regarded as advantageous if the condition $0.25*NA_M^2 < SAD/P_{CHAR} < 0.8$ holds true for the first manipulator surface and the condition $SAD/P_{CHAR} < 1.5$ holds true for the second manipulator surface.

Different combinations of projection lenses and manipulator devices that can be used therein are illustrated below on the basis of specific exemplary embodiments.

Figure 16:
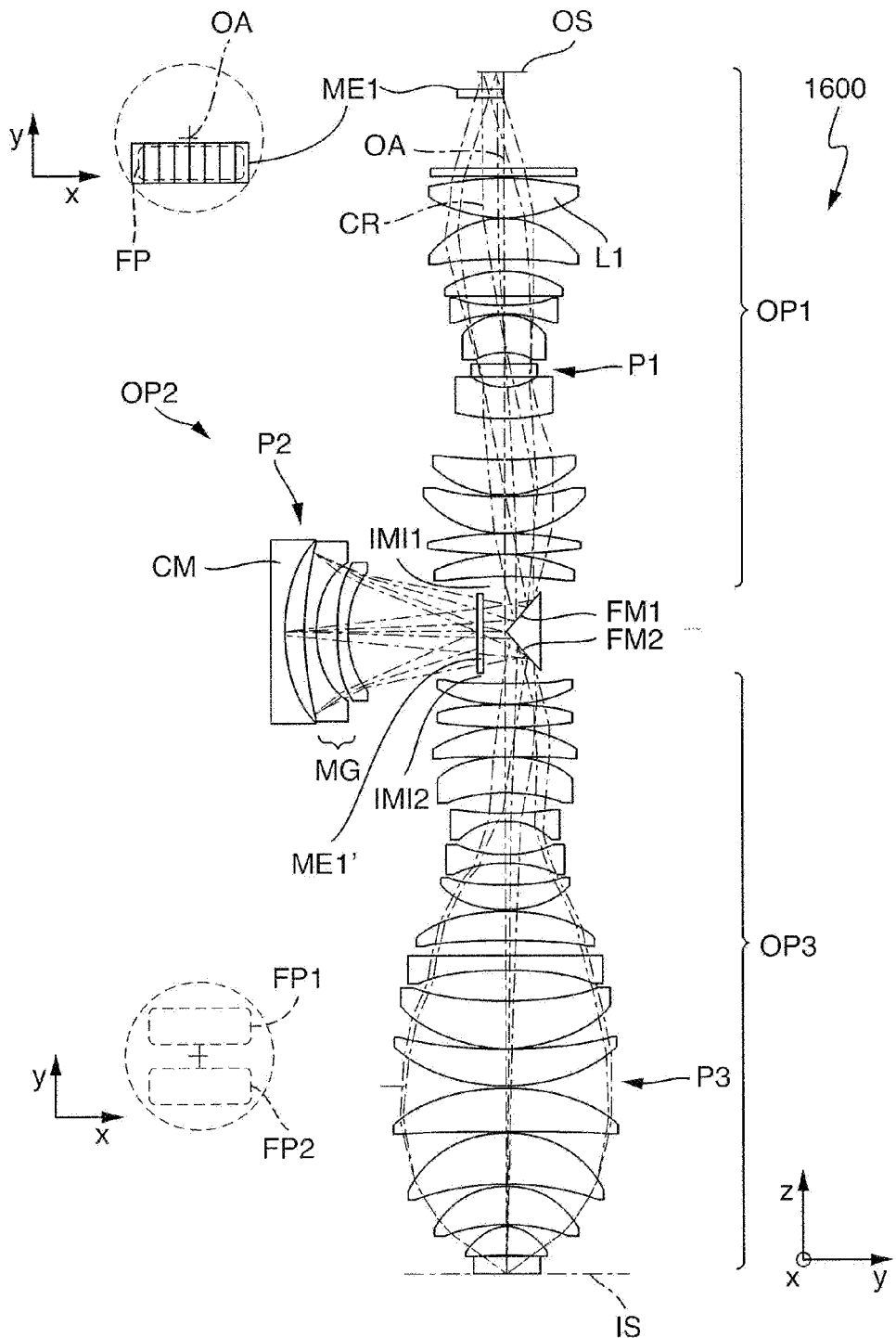
FIGS. 16 and 17 show schematic meridional lens element sections of embodiments of catadioptric projection lenses which are equipped with near-field manipulator elements.

FIG. 16 shows a schematic meridional lens element section of an embodiment of a catadioptric projection lens 1600 with selected beams for clarifying the imaging beam path of the projection radiation passing through the projection lens during operation. The projection lens is provided, as an imaging system having a demagnifying effect, for imaging a mask pattern arranged in its object plane OS on a reduced scale, for example on a scale of 4:1, onto its image plane IS oriented parallel to the object plane. In this case, exactly two real intermediate images IMI1, IMI2 are generated between object plane and image plane. A first lens part OP1, which is constructed explicitly with transparent optical elements and is therefore purely refractive (dioptric), is designed such that the pattern of the object plane is imaged into the first intermediate image IMI1 substantially without any change in size. A second, catadioptric lens part OP2 images the first intermediate image IMI1 onto the second intermediate image IMI2 substantially without any change in size. A third, purely refractive lens part OP3 is designed for imaging the second intermediate image IMI2 into the image plane IS with high demagnification.

Pupil surfaces P1, P2, P3 of the imaging system lie between the object plane and the first intermediate image, between the first and second intermediate images, and also between the second intermediate image and the image plane, in each case where the chief ray CR of the optical imaging intersects the optical axis OA. The aperture stop AS of the system is fitted in the region of the pupil surface P3 of the third lens part OP3. The pupil surface P2 within the catadioptric second lens part OP2 lies in direct proximity to a concave mirror CM.

If the projection lens is designed and operated as an immersion lens, then during the operation of the projection lens radiation passes through a thin layer of an immersion liquid situated between the exit surface of the projection lens and the image plane IS. Immersion lenses having a comparable basic construction are disclosed e.g. in the International Patent Application WO 2004/019128 A2. Image-side numerical apertures NA>1 are possible during immersion operation. A configuration as a dry lens is also possible; here the image-side numerical aperture is restricted to values NA<1.

The exemplary embodiment shown in FIG. 16 corresponds, in terms of the optical construction (without manipulator elements), to the exemplary embodiment from FIG. 6 of US 2009/0046268 A1. The disclosure content of the document with regard to the basic construction of the projection lens (optical specification) is incorporated by reference in the content of this description.

The catadioptric second lens part OP2 contains the sole concave mirror CM of the projection lens. A negative group NG comprising two negative lens elements is situated directly upstream of the concave mirror. In this arrangement, occasionally designated as a Schupmann achromate, the Petzval correction, i.e. the correction of the image field curvature, is achieved by the curvature of the concave mirror and the negative lens elements in proximity thereto, and the chromatic correction is achieved by the refractive power of the negative lens elements upstream of the concave mirror and the stop position with respect to the concave mirror.

A reflective deflection device serves for separating the beam passing from the object plane OS to the concave mirror CM, or the corresponding partial beam path, from that beam or partial beam path which passes, after reflection at the concave mirror, between the latter and the image plane IS. For this purpose, the deflection device has a planar first deflection mirror FM1 for reflecting the radiation coming from the object plane to the concave mirror CM, and a second deflection mirror FM2, which is oriented at right angles with respect to the first deflection mirror FM1 and which deflects the radiation reflected by the concave mirror in the direction of the image plane IS. Since the optical axis is folded at the deflection mirrors, the deflection mirrors are also designated as folding mirrors in this application. The deflection mirrors are tilted, e.g. by 45°, relative to the optical axis OA of the projection lens about tilting axes running perpendicular to the optical axis and parallel to a first direction (x-direction). In the case where the projection lens is designed for scanning operation, the first direction (x-direction) is perpendicular to the scanning direction (y-direction) and thus perpendicular to the direction of movement of the mask (reticle) and the substrate (wafer). For this purpose, the deflection device is realized by a prism whose externally reflectively coated cathetus surfaces oriented perpendicularly to one another serve as deflection mirrors.

The intermediate images IMI1, IMI2 in each case lie in optical proximity to the folding mirrors FM1 and FM2, respectively, closest to them, but are at a minimum optical distance from the folding mirrors, with the result that possible defects on the mirror surfaces are not imaged sharply into the image plane and the planar deflection mirrors (plane mirrors) FM1, FM2 lie in the region of moderate radiation energy density.

The positions of the (paraxial) intermediate images define field planes of the system which are optically conjugate with respect to the object plane and with respect to the image plane. The deflection mirrors therefore lie in optical proximity to field planes of the system, which is also designated as "near-field" in the context of this application. In this case, the first deflection mirror is arranged in optical proximity to a first field plane, which is associated with the first intermediate image IMI1, and the second deflection mirror is arranged in optical proximity to a second field plane, which is optically conjugate with respect to the first field plane and is associated with the second intermediate image IMI2.

By way of example, the subaperture ratio SAR can be used for quantifying the position of an optical element or an optical surface in the beam path.

In accordance with an illustrative definition, the subaperture ratio SAR of an optical surface of an optical element in the projection beam path is defined as the quotient between the subaperture diameter SAD and the optically free diameter DCA in accordance with $SAR := SAD/DCA$. The subaperture diameter SAD is given by the maximum diameter of a partial surface of the optical element that is illuminated with rays of a beam emerging from a given field point. The optically free diameter DCA is the diameter of the smallest circle around a reference axis of the optical element, wherein the circle includes that region of the surface of the optical element which is illuminated by all rays coming from the object field.

In a field plane (object plane or image plane or intermediate image plane), SAR=0 accordingly holds true. In a pupil plane, SAR=1 holds true. "Near-field" surfaces thus have a subaperture ratio which is close to 0, while "near-pupil" surfaces have a subaperture ratio which is close to 1.

In this application, the optical proximity or the optical distance of an optical surface with respect to a reference plane, e.g. a field plane or a pupil plane, is described by the so-called subaperture ratio SAR. The subaperture ratio SAR of an optical surface is defined for the purposes of this application as follows:

$$SAR = \text{sign } CRH(MRH/(|CRH|+|MRH|))$$

where MRH denotes the marginal ray height, CRH denotes the chief ray height and the signum function sign x denotes the sign of x, where according to convention sign 0=1 holds true. Chief ray height is understood to mean the ray height of the chief ray of a field point of the object field with maximum field height in terms of absolute value. The ray height should be understood here to be signed. Marginal ray height is understood to mean the ray height of a ray with maximum aperture proceeding from the point of intersection of the optical axis with the object plane. This field point does not have to contribute to the transfer of the pattern arranged in the object plane—particularly in the case of off-axis image fields.

The subaperture ratio is a signed variable that is a measure of the field or pupil proximity of a plane in the beam path. The subaperture ratio is normalized by definition to values of between −1 and +1, the subaperture ratio being zero in each field plane and the subaperture ratio jumping from −1 to +1, or vice versa, in a pupil plane. A subaperture ratio of 1 in terms of absolute value thus determines a pupil plane.

Near-field planes therefore have subaperture ratios which are close to 0, while near-pupil planes have subaperture ratios which are close to 1 in terms of absolute value. The sign of the subaperture ratio indicates the position of the plane upstream or downstream of a reference plane.

A first manipulator element ME1 of a wavefront manipulation system, the first manipulator element being transparent to the projection radiation, is arranged in the projection beam path at a small finite distance directly downstream of the object plane OS. The manipulator element substantially has the form of a rectangular plate, the longer side of which runs in the x-direction and the shorter side of which runs in the y-direction (scanning direction). The plate is situated completely outside the optical axis at a distance alongside the optical axis (off-axis arrangement). As can be discerned in the axial plan view shown on the left, the manipulator element is dimensioned and arranged such that the footprint (FP, illustrated in a dashed manner)—which is largely rectangular in this region—of the projection radiation lies on that region of the manipulator element through which radiation can be transmitted (also cf. FIG. 3). With the aid of an actuating device (not shown), the surface shape and/or refractive index distribution of the first manipulator surface formed by the first manipulator element can be reversibly altered in such a way that a plurality of maxima and adjacent minima of an optical path length change of the projection radiation can be generated in the x-direction across the optically used region. The profiles of the maxima and minima are schematically illustrated by solid lines running in the y-direction.

The distance between the active manipulator surface and the object plane as measured parallel to the optical axis is so small that a subaperture ratio SAR of less than 0.1 is present at the location of the manipulator surface and that the condition SAD/DFP<0.1 holds true.

The first manipulator element ME1 is arranged between the object plane OS and the first lens element L1 of the projection lens, the lens element exhibiting refractive power, to be precise the first manipulator element being arranged closer to the object plane than to the lens element.

In projection lenses of this type there are further positions in which, as an alternative or in addition to the near-object manipulator element, a manipulator element can be arranged in the projection beam path. One position is situated geometrically between the prism carrying the folding mirrors FM1, FM2 and the concave mirror CM, to be precise near the folding mirrors FM1, FM2. The illustrated position of the first manipulator element ME1' is situated in direct optical proximity to the first intermediate image IMI1 directly downstream thereof, and furthermore in direct optical proximity to the second intermediate image IMI2 directly upstream of the intermediate image. The subaperture ratio SAR is less than 0.2 in both cases; the condition SAD/DFP<0.2 holds true in each case. Preference is given to a position in which the partial beam path leading from the object plane to the concave mirror, after reflection at the first deflection mirror FM1, is spatially separate from the second partial beam path, leading from the concave mirror via the second folding mirror FM2 to the image plane. A first footprint FP1 arises at the location of the manipulator in the first partial beam path, while a second footprint FP2 is present in the second partial beam path. The footprints are situated diametrically opposite one another with respect to the optical axis OH, as shown by the detail at the bottom left.

In the illustrated position it is now possible to arrange a manipulator element such that it acts only in one of the partial beam paths, that is to say either only in the first partial beam path (between object plane and concave mirror) or only in the second partial beam path (between concave mirror and image plane). It is also possible to fit at this position a manipulator element through which radiation passes in different directions and which acts in both partial beam paths.

In a manner similar to that in the position directly downstream of the object plane it is possible to set a desired wavefront change which alternates multiply between maximum values and minimum values in the x-direction, with the result that a characteristic period in the x-direction can be assigned to the optical path length change.

Figure 17:
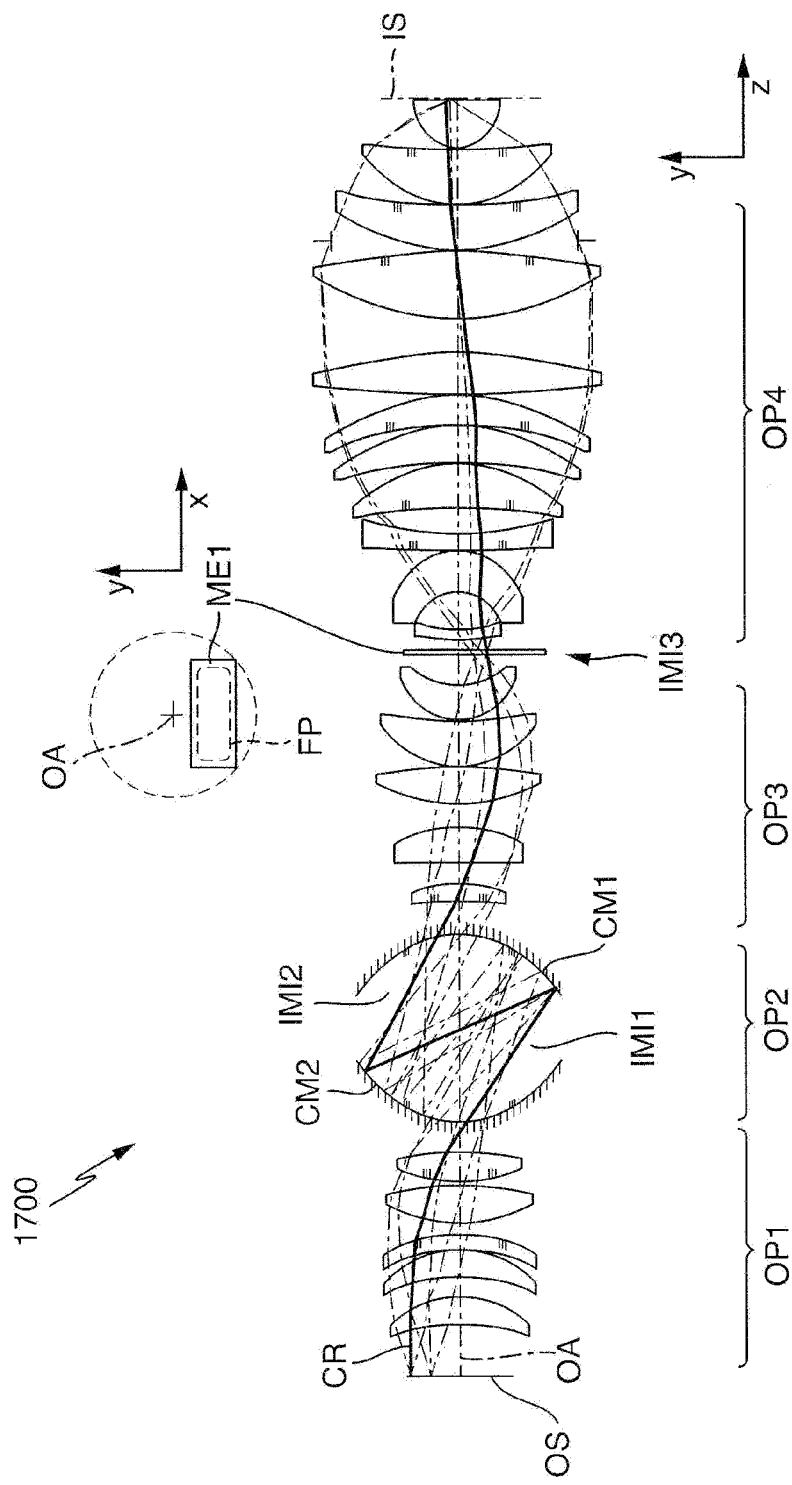

FIG. 17 shows an exemplary embodiment of a projection lens 1700 which is equipped with a first manipulator element ME1 situated in a near-field arrangement in the projection beam path. The optical construction of the projection lens (without manipulator element) corresponds to that from FIG. 13 of U.S. Pat. No. 7,446,952 B2, which is incorporated by reference in the content of this description. The projection lens has a first, refractive lens part OP1, which generates a first intermediate image IMI1 proceeding from the object in the object plane OS. The first intermediate image is imaged into a second intermediate image IMI2 with the aid of a catadioptric second lens part OP2. The second lens part consists of two concave mirrors CM1, CM2, the mirror surfaces of which face one another and are in each case situated in a near-field arrangement (near an intermediate image, remote from the intervening pupil plane). A refractive third lens part OP3 images the second intermediate image into a third intermediate image IMI3, which is in turn imaged by a refractive fourth lens part OP4 with high demagnification to form the final image in the image plane IS. All the lens parts have a common, rectilinear (nonfolded) optical axis OA (in-line system). Further details can be gathered from U.S. Pat. No. 7,446,952 B2 and are therefore not specifically indicated here.

The intermediate field plane in which the third intermediate image IMI3 is situated, the third intermediate image being demagnified relative to the object, lies in a relatively readily accessible manner between the last concave lens element of the third lens part OP3 on the object side and the first convex lens element of the fourth lens part on the object side. Here a first manipulator element ME1 can be inserted into the projection beam path without risk of collision with the lens elements of the basic construction. If appropriate, provision can be made of a changing device for exchanging and replacing manipulator elements in the projection beam path. The first manipulator element ME1 can have the rectangular shape—illustrated in the axial schematic detail view—having the long side in the x-direction and the short side in the y-direction and can be arranged outside the optical axis OA. The footprint FP—depicted in a dashed manner—of the projection radiation here lies fully in the usable area of the first manipulator element. A suitable actuating device makes it possible to set an optical effect which varies multiply between maximum values and minimum values in the x-direction and which corresponds to a varying optical path length change of the projection radiation. Alternatively or additionally, the projection lens can also have a corresponding manipulator element at other locations as well, for example directly downstream of the object plane OS in a near-field position. It would also be possible to fit, in addition to the first manipulator element ME1 shown, which is situated downstream of the third intermediate image in the direction of transmission of radiation, yet another manipulator element, likewise situated in direct optical proximity to the third intermediate image upstream thereof (cf. FIG. 9).

Exemplary embodiments of further projection lenses having a rectilinear optical axis (in-line systems) and a plurality (exactly two) of intermediate images are disclosed in WO 2005/069055 A2, the disclosure content of which is incorporated by reference in the content of this description. These can also be equipped with one or more near-field manipulator elements of a wavefront manipulation system of the type described here. By way of example, in one of the projection lenses from FIGS. 30 to 32 or 36 to 38 of the document, a near-field dynamically variable manipulator element can be arranged directly downstream of the object plane between the latter and the first lens element there in a position at which the subaperture ratio SAR is less than 0.2 and/or the condition SAD/DFP<0.2 holds true.

Manipulator elements of wavefront manipulation systems of the type described here can operate according to different principles. FIGS. 18 to 21 illustrate by way of example manipulators which can be used alternatively or in combination within a projection lens of the type illustrated here (e.g. FIGS. 16 and 17) or in other suitable projection lenses in the context of wavefront manipulation systems.

Figure 18:
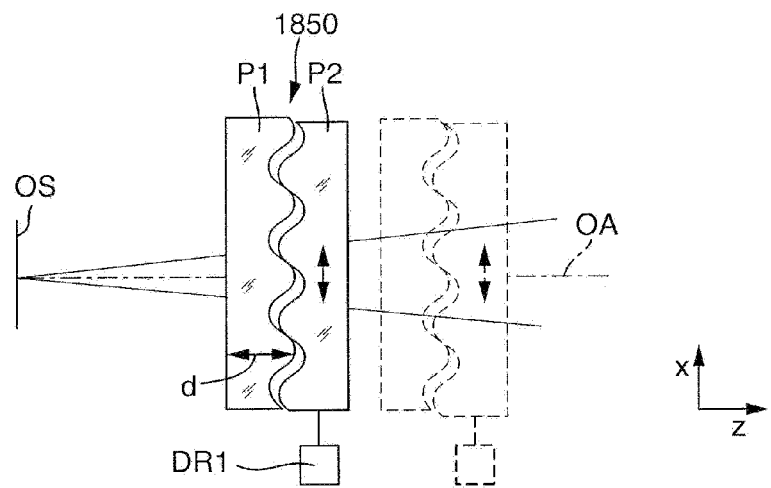
FIGS. 18 to 21 schematically show exemplary embodiments of dynamically adjustable manipulators which can be used at near-field positions within a projection lens in the context of wavefront manipulation systems.

The manipulator 1850 in FIG. 18 has two transparent plates P1, P2, which can be incorporated with their plate surfaces in each case perpendicular to the optical axis OA of the projection lens in a near-field position where SAR<0.2 for example directly downstream of the object plane OS. The plates can have a rectangular shape having an extent which can be multiply greater in the x-direction than in the y-direction—running perpendicular thereto—of the projection lens. The entrance side of the first plate P1 facing the object plane OS is planar. Equally, the exit side of the second plate P2 facing the image plane is planar. The plate surfaces facing one another each have a wavy surface shape, wherein the wave valleys and wave peaks run parallel to the y-direction and the plate thickness d varies periodically in the x-direction. The wave pattern at the exit side of the first plate P1 and the wave pattern of the entrance side of the second plate P2 are complementary to one another with regard to the characteristic period measured in the x-direction and with regard to the amplitude of the thickness variation. The plates can be displaced relative to one another in the x-direction, which is achieved in the exemplary embodiment by virtue of the fact that the first plate P1 is installed in a fixed manner and the second plate P2 is movable parallel to the x-direction with the aid of an actuating device DR1. However, it is also possible for both plates to be embodied in a movable fashion.

Each of the plates P1, P2 is composed of a material having a refractive index n (e.g. fused silica or calcium fluoride) and brings about, in the case of perpendicular transmission of radiation, an optical path length difference $\Delta OPL=\Delta d*n-1$, where $\Delta d$ is the change in the thickness d of the optical element through which radiation is transmitted in the z-direction.

That surface area of this manipulator which is effective for producing a wavefront change results from the difference between the effects of the two plates. If the latter are displaced into a neutral position in which the "wave peaks" of the first plate are aligned exactly with the "wave valleys" of the second plate (i.e. lie one behind the other in the z-direction), then the effects of the two plates compensate for one another in such a way that the overall effect of a plane plate arises. A relative displacement of the second plate with respect to the first plate perpendicularly to the direction of transmission of radiation out of the zero position establishes a wavefront change that varies periodically in the x-direction with multiple alternation between maximum and minimum values, wherein the intensity of the resulting wavefront change can be set continuously via the displacement distance (also cf. EP 0 851 304 A2). In this case, the effective manipulator surface area lies in the region of the interspace formed between the plates. The desired wavefront effect that varies multiply transversely with respect to the direction of transmission of radiation arises here.

The use of a single manipulator of this type having two plates may be sufficient in some cases, in particular in those cases in which only basic deformations have to be set. In order to increase the flexibility and diversity of the wavefront changes that can be set, two or more plate pairs disposed one behind another can be provided, as indicated by the second manipulator shown by dashed lines. A plurality of manipulators disposed one behind another can be designed such that different displacement directions perpendicular to the optical axis are possible, e.g. displacement directions perpendicular to one another. More flexible manipulator functions can thereby be realized.

Figure 19:
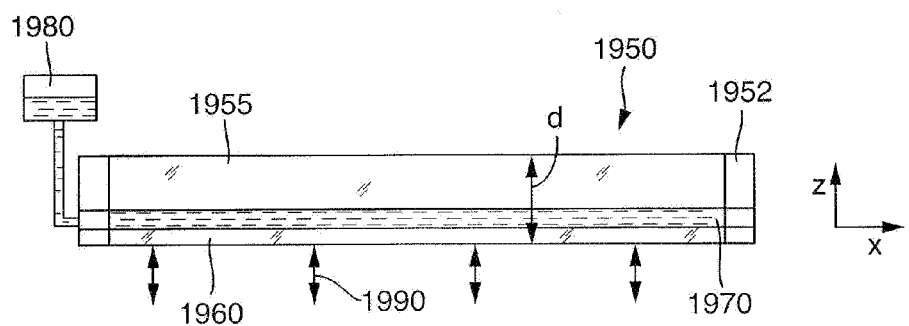
Figure 20:
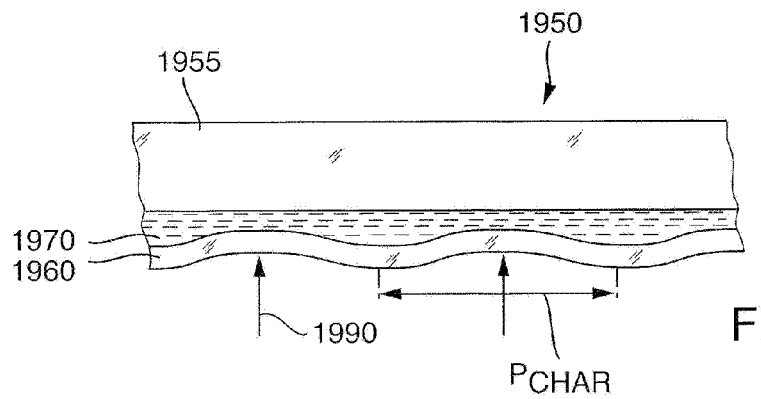

FIGS. 19 and 20 schematically show sections through a different embodiment of a manipulator element 1950, which is shown in a neutral position (zero position) in FIG. 19 and as an excerpt in FIG. 20 in a functional position in which a multiple alternation between minimum values and maximum values of the optically active thickness or of an optical path length change is set in the x-direction. The manipulator element uses principles described for different purposes and in a different design in the U.S. Pat. No. 7,830,611 B2 in the name of the present applicant. The disclosure content of the document is incorporated by reference in the content of the present description.

The manipulator element 1950 has a multilayered construction. A relatively thick, flexurally stiff transparent plane plate 1955 is accommodated in a frame-type mount 1952, the thickness of which plane plate can be e.g. in the cm range. A further plane plate 1960 is accommodated at a distance from the plate, and is significantly thinner than the relatively torsionally stiff plate 1955. The thickness can be e.g. in the range of one to 2 mm. A plane-parallel interspace remains between the plates 1955, 1960, and a liquid 1970 that is transparent to the projection radiation is filled into the interspace when the manipulator is ready for operation. The thickness of the interspace is generally small, e.g. less than 1 mm, in particular less than 10 μm. The liquid reservoir between the plates is connected to a pressure device 1980, via which the liquid pressure of the liquid in the interspace can be set e.g. to a constant value. The liquid and the transparent materials of the plates have a very similar refractive index, wherein a ratio between the refractive index of the plates and the refractive index of the liquid is preferably between 0.99 and 1.01.

The entire arrangement is rectangular in axial plan view (parallel to the z-direction) and somewhat larger than that region through which radiation is transmitted in the case of a near-field arrangement of the manipulator in the region of the "footprint". On the side of the thin plate 1960, there are fitted actuators 1990 situated opposite in pairs outside the region through which radiation can be transmitted at regular distances from one another at the longitudinal sides of the manipulator. By way of example, piezoelectrically actuated actuators can be involved. The actuators are designed such that they can act on the outer side of the thin plate with a press-on force acting substantially perpendicularly to the plate surface of the thin plate (cf. FIG. 20). Suitable driving of the actuators makes it possible to establish a wavy deformation of the thin plate 1960 with a predefinable amplitude, wherein the "wave valleys" run parallel to the y-direction and the characteristic period length PCHAR of the wavy deformation, the characteristic period length being measured in the x-direction, can be set to different values by selection of the actuators respectively driven.

If radiation is transmitted to this arrangement parallel to the z-direction, that is to say perpendicularly to the torsionally stiff thicker plate 1955, then the overall arrangement in the neutral position shown in FIG. 19 acts like a plane-parallel plate, with the result that the same optical path length change ΔOPL is introduced over the entire illuminated cross section. If an optical path length change that varies periodically in the x-direction is intended to be introduced, then corresponding actuators are activated, with the result that the thin plane plate 1960 is pressed in the direction of the liquid at the corresponding locations. Local minima of the total thickness d through which radiation is transmitted arise in these regions, while local maxima respectively arise between the activated actuators. To a first approximation, therefore, a wavelength change that varies periodically in the x-direction can be set in a manner similar to that explained in connection with FIGS. 2 and 3. By driving different groups of actuators, it is possible to set different "wavelengths" or different characteristic periods PCHAR in x-direction.

If necessary, it is also possible to use modifications of this arrangement in which actuators are arranged not only at the edge outside the region through which radiation can be transmitted, but also within the region through which radiation can be transmitted (cf. FIGS. 10, 11 from U.S. Pat. No. 7,830,611 B2).

Figure 21:
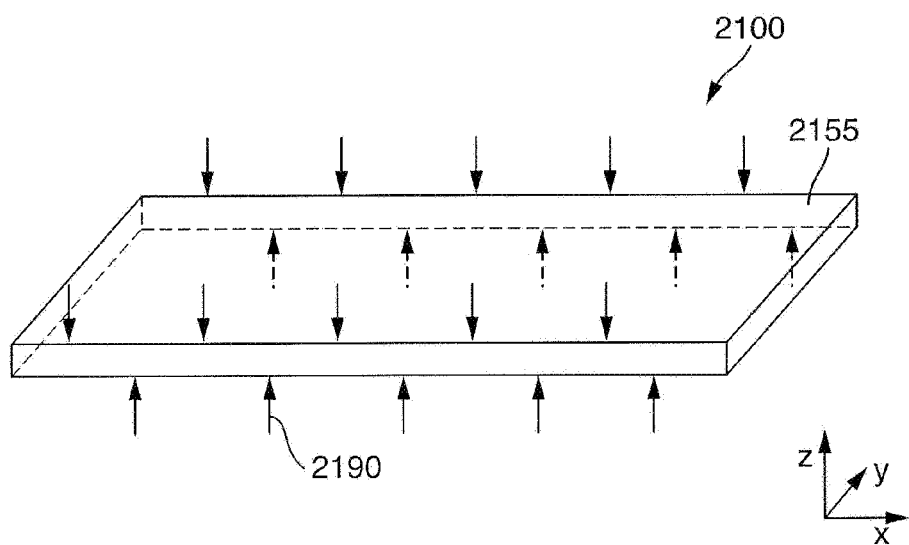

The obliquely perspective schematic illustration in FIG. 21 shows a further exemplary embodiment of a manipulator 2100 which can be used in the context of a wavelength manipulator system of the type described here. At the edge of the deformable thin rectangular plane plate 2155, groups of actuators 2190 are fitted alternately on opposite sides of the plane plate. Via actuators being suitably driven in groups, it is possible to deform the plane plate in a wavy manner, wherein the wave valleys and wave peaks then run parallel to the y-direction and the wave peaks and respectively valleys are at a distance from one another in the x-direction, which distance corresponds to the characteristic period PCHAR of the corresponding case of application.

The invention claimed is:

1. A projection lens having an object plane and an image plane, the projection lens comprising:
   a plurality of optical elements comprising optical surfaces arranged in a projection beam path so that, during use of the projection lens, the optical elements image a pattern in the object plane into the image plane via electromagnetic radiation having an operating wavelength that is less than 260 nm; and
   a wavefront manipulation system configured so that, during use of the projection lens, the wavefront manipulation system dynamically influences a wavefront of the electromagnetic radiation as it passes from the object plane to the image plane, the wavefront manipulation system comprising:
      a first manipulator comprising a first manipulator surface in the projection beam path; and
      a first actuating device configured to reversibly alter: a) a surface shape of the first manipulator surface; and/or b) a refractive index distribution of the first manipulator surface,
   wherein:
      during use of the projection lens:
         the first manipulator has an optically used region with an effective diameter $D_{FP}$;
         a number $N_{MAX}>1$ of maxima of an optical path length change are generated across the optically used region of the first manipulator according to a characteristic period $P_{CHAR}$;
         a number $N_{MIN}>1$ of minima of the optical path length change are generated across the optically used region of the first manipulator according to the characteristic period $P_{CHAR}$; and $$P_{CHAR}=D_{FP}/((N_{MAX}+N_{MIN})/2);$$

the first manipulator surface is a finite first distance from a closest field plane of the projection lens in optical proximity to the closest field plane so that each beam emerging from a field point of the closest field plane at the first manipulator surface illuminates a subaperture having a subaperture diameter SAD; and
         SAD/DFP<0.2 at the first manipulator surface.

2. The project lens of claim 1, wherein the wavefront manipulation system has only the first manipulator in optical proximity to the closest field plane, and the finite distance is dimensioned so that at the first manipulator surface upon activation of the first manipulator the condition $$0.25*NA_M^2<SAD/P_{CHAR}<0.48$$

is fulfilled, wherein $NA_M$ is a numerical aperture of the electromagnetic radiation at the first manipulator surface.

3. The projection lens of claim 2, wherein the closest field plane is the object plane.

4. The projection lens of claim 1, wherein the closest field plane is the object plane.

5. The projection lens of claim 1, wherein no optical surface having refractive power is arranged between the object plane and the first manipulator surface, and $NA_M$ is equal to an object-side numerical aperture $NA_O$.

6. The projection lens of claim 1, wherein:
   the wavefront manipulation system further comprises:
      a second manipulator which comprises a second manipulator surface; and a second actuating device configured to reversibly alter:
  a) a surface shape of the second manipulator surface; and/or b) a refractive index distribution of the second manipulator surface;
during use of the projection lens:
  the second manipulator has an optically used region with an effective diameter $D'_{FP}$;
  a number $N'_{MAX} > 1$ of maxima of the optical path length change are generated across the optically used region of the second manipulator according to a characteristic period $P'_{CHAR}$;
  a number $N'_{MIN} > 1$ of minima of the optical path length change are generated across the optically used region of the second manipulator according to the characteristic period $P'_{CHAR}$; and $$P'_{CHAR} = D'_{FP} / ((N'_{MAX} + N'_{MIN})/2);$$

the second manipulator surface is a finite second distance from a closest field plane of the projection lens in optical proximity to the closest field plane so that each beam emerging from a field point of the closest field plane at the second manipulator surface illuminates a subaperture having a subaperture diameter SAD'; and
  $SAD'/D'_{FP} < 0.2$ at the first manipulator surface.

7. The projection lens of claim 6, wherein a numerical aperture of the electromagnetic radiation at the first manipulator surface is equal to a numerical aperture of the electromagnetic radiation at the second manipulator surface.

8. The projection lens of claim 6, wherein the first distance is equal to the second distance.

9. The projection lens of claim 6, wherein:
  the projection lens is configured so that, during use of the projection lens, the projection lens has at least one intermediate image in a region of an intermediate image plane;
  the intermediate image plane is between the object plane and the image plane; and
  the closest field plane is the intermediate image plane.

10. The projection lens of claim 9, wherein the first manipulator surface is downstream of the intermediate image plane along the projection beam path, and the second manipulator surface is upstream of the intermediate image plane along the projection beam path.

11. The projection lens of claim 6, wherein:
  at the first manipulator surface upon activation of the first manipulator, $0.012 < SAD/P_{CHAR} < 0.85$; and
  at the second manipulator surface upon activation of the second manipulator, $0.012 < SAD/P'_{CHAR} < 0.85$.

12. The projection lens of claim 6, wherein:
  the second manipulator surface is directly downstream of the first manipulator surface along the projection beam path;
  the numerical aperture of the electromagnetic radiation at the first manipulator surface is equal to the numerical aperture of the electromagnetic radiation at the second manipulator surface;
  the first distance is less than the second distance;
  the subaperture diameter at the first manipulator surface is different from the supaperture diameter at the second manipulator surfaces;
  for the first manipulator surface, $0.25 * NA_M^2 < SAD/P_{CHAR} < 0.8$; and
  for the second manipulator surface, $SAD'/P'_{CHAR} < 1.5$.

13. The projection lens of claim 1, wherein:
  the projection lens has an effective object field which lies outside an optical axis of the projection lens;
  the effective object field has an aspect ratio that is greater than 2:1 between a longer side and a shorter side;
  the optically used region has approximately a rectangular shape having an aspect ratio of greater than 2:1; and
  during use of the projection lens, the first manipulator acts parallel to the longer side so that the first manipulator generates a plurality of maxima and a plurality of minima of the optical path length change of the projection radiation in this direction.

14. An apparatus, comprising:
  a projection lens according to claim 1; and
  an illumination system configured to illuminate the object field of the projection lens,
  wherein the apparatus is a projection exposure apparatus.

15. The apparatus of claim 14, further comprising a light source configured to provide the electromagnetic radiation.

16. The apparatus of claim 14, further comprising a control module configured to drive: a) the wavefront manipulation system; and b) at least one manipulator.

17. A method comprising:
  using an illumination system to illuminate a pattern of a mask with electromagnetic radiation having an operating wavelength that is less than 260 nm; and
  using a projection lens according to claim 1 to project at least part of the pattern of the mask onto a radiation-sensitive material via the electromagnetic radiation, the mask being in the object plane of the projection lens, and the radiation-sensitive material being in the image plane of the projection lens.

18. A method comprising:
  a) using an illumination system to illuminate a pattern of a mask with electromagnetic radiation having an operating wavelength that is less than 260 nm;
  b) using a projection lens to project at least part of the pattern of the mask onto a radiation-sensitive material via the electromagnetic radiation, the pattern being in an object plane of the projection lens and the radiation-sensitive material being in an image plane of the projection lens,
  wherein:
    b) comprises influencing a wavefront of the electromagnetic radiation by altering a shape and/or a refractive index of a first manipulator surface of a first manipulator, the first manipulator surface being arranged in a beam path of the electromagnetic radiation between the object field and the image field;
    the first manipulator has an optically used region with an effective diameter $D_{FP}$;
    a number $N_{MAX} > 1$ of maxima of an optical path length change are generated across the optically used region of the first manipulator according to a characteristic period $P_{CHAR}$;
    a number $N_{MIN} > 1$ of minima of the optical path length change are generated across the optically used region of the first manipulator according to the characteristic period $P_{CHAR}$; and $$P_{CHAR} = D_{FP} / ((N_{MAX} + N_{MIN})/2);$$

the first manipulator surface is a finite first distance from a closest field plane of the projection lens in optical proximity to the closest field plane so that each beam emerging from a field point of the closest field plane at the first manipulator surface illuminates a subaperture having a subaperture diameter SAD; and
    $SAD/D_{FP} < 0.2$ at the first manipulator surface.

19. The method of claim 18, comprising successively performing first and second exposures, wherein a field-dependent distortion during the second exposure is matched, by activation of the first manipulator, to a structure produced during the first exposure so that the structures produced in the first and second exposures lie one on top of another with higher superimposition accuracy than without activation of the first manipulator.

20. The method of claim 18, comprising influencing the wavefront so that distortion values having different magnitudes are set for different field points.

* * * * *